（12) United States Patent
May et al.

(10) Patent No.: US 12,198,924 B2
(45) Date of Patent: Jan. 14, 2025

(54) EPITAXIAL ALKALI HALIDE LAYERS FOR III-V SUBSTRATE RECYCLING

(71) Applicant: Alliance for Sustainable Energy, LLC, Golden, CO (US)

(72) Inventors: Brelon James May, Idaho Falls, ID (US); David Levi Young, Golden, CO (US); Aaron Joseph Ptak, Littleton, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 190 days.

(21) Appl. No.: 18/068,735

(22) Filed: Dec. 20, 2022

(65) Prior Publication Data

US 2023/0197436 A1   Jun. 22, 2023

Related U.S. Application Data

(60) Provisional application No. 63/291,689, filed on Dec. 20, 2021.

(51) Int. Cl.
| | | |
|---|---|---|
| H01L 21/02 | (2006.01) |
| B08B 3/08 | (2006.01) |
| C30B 23/02 | (2006.01) |
| C30B 25/18 | (2006.01) |
| C30B 29/12 | (2006.01) |
| C30B 29/40 | (2006.01) |

(52) U.S. Cl.
CPC .......... H01L 21/02079 (2013.01); B08B 3/08 (2013.01); C30B 23/025 (2013.01); C30B 25/186 (2013.01); C30B 29/12 (2013.01); C30B 29/40 (2013.01)

(58) Field of Classification Search
CPC ... B08B 3/08; H01L 21/02079; C30B 23/025; C30B 25/186; C30B 29/12; C30B 29/40
See application file for complete search history.

(56) References Cited

U.S. PATENT DOCUMENTS

2012/0288673 A1* 11/2012 Clemens ................. C30B 25/06
428/141

OTHER PUBLICATIONS

Barkai and Grünbaum, "The Epitaxial Growth of Germanium Films Onto NaCl/MICA Substrates," Thin Solid Films, vol. 78, 1981, 6 pages.
Bauhuis, G.J. et al., "Wafer reuse for repeated growth of III-V solar cells," Progress in Photovoltaics: Research and Applications, vol. 18, 2010, 5 pages.
Bunton and Day, "Epitaxial Thin Films of ZnS and GaAs Prepared by R.F. Sputtering on NaCl Substrates," Thin Solid Films, Elsevier Sequoia, vol. 10, 1972, 10 pages.
Cheng, C-W et al., "Epitaxial lift-off process for gallium arsenide substrate reuse and flexible electronics," Nature Communications, Mar. 2013, 7 pages.

(Continued)

*Primary Examiner* — Robert M Kunemund
(74) *Attorney, Agent, or Firm* — Michael A. McIntyre

(57) ABSTRACT

The present disclosure relates to a method that includes depositing a first layer onto a substrate, depositing a second layer onto a surface of the first layer, and separating the substrate from the second layer, where the substrate includes a first III-V alloy, the second layer includes second III-V alloy, and the first layer includes a material that includes at least two of a Group 1A element, a Group 2A element, a Group 6A element, and/or a halogen.

30 Claims, 30 Drawing Sheets

(56) References Cited

OTHER PUBLICATIONS

Dhere and Parikh, "HEED and TEM study of epitaxial CdS/InP thin films on NaCl," Journal of Vacuum Science Technology, vol. 17, No. 3, May/Jun. 1980, 4 pages.
Evans, T. and Noreika, A.J., "Effect of Gaseous Environment on the Structure of Sputtered GaAs Films on NaCl Substrates," Philosophical Magazine, vol. 13, No. 124, 12 pages.
Flemish, J.R. et al., "Selective Wet Etching of GaInP, GaAs, and InP in Solutions of HCI, CH3COOH, and H2O2," Journal of Electrochemical Society, vol. 140, No. 3, Mar. 1993, 5 pages.
Gutierrez, C.J. et al., "Mossbauer studies of Fe(100)/Ag(100) multilayers grown on NaCl(100) by molecular beam epitaxy," Journal of Magnetism and Magnetic Materials, vol. 99, 1991, 7 pages.
Hjort, K., "Sacrificial etching of III-V compounds for micromechanical devices," J. Micromech. Microeng., vol. 6, 1996, 7 pages.
Kiguchi, M. et al., "Heteroepitaxial growth of alkali halide solid solution on GaAs(100)," Journal of Crystal Growth, 2002, 5 pages.
Konagai, M. et al., "High Efficiency GaAs Thin Film Solar Cells by Peeled Film Technology," Journal of Crystal Growth, vol. 45, 1978, 4 pages.
Lee, K. et al., "Non-Destructive Wafer Recycling for Low-Cost Thin-Film Flexible Optoelectronics," Advanced Functional Materials, vol. 24, 2014, 8 pages.
Lee, D.K. et al., "Water-Soluble Epitaxial NaCl Thin Film for Fabrication of Flexible Devices," vol. 7, 2017, 7 pages.
Nakamura, Y. et al., "Heteroepitaxial growth of alkali halides on a GaAs(001) substrate," Journal of Vacuum Science Technology A, vol. 10, No. 2, Mar./Apr. 1992, 3 pages.
O'Neal, J.E. et al., "Epitaxy of GaAs on Vacuum-Cleaved Rocksalt," Journal of Crystal Growth 2, 1968, 5 pages.
Park et al., "Germanium-on-Nothing for Epitaxial Liftoff of GaAs Solar Cells," Joule 3, Jul. 17, 2019, 13 pages.
Saiki, K. et al., "Heteroepitaxial growth of alkali halide thin films on GaAs substrates," Surface Science, 1992, 7 pages.
Schermer, J.J. et al., "Photon confinement in high-efficiency, thin-film III-V solar cells obtained by epitaxial lift-off," Thin Solid Films, 2006, 9 pages.
Sharma, S. et al., "Novel Epitaxial Lift-Off for Flexible, Inexpensive GaAs Solar Cells," 2020 47th IEEE Photovoltaics Specialists Conference, Jun. 15, 2020 through Aug. 21, 2020, added to IEEE Xplore Jan. 5, 2021, 3 pages.
Shimaoka and Chang, "Structure of Silicon Films Evaporated onto a Clean NaCl Substrate," Journal of Vacuum Science and Technology, vol. 9, No. 1, 1971, 4 pages.
Shimaoka and Chang, "Structure of Germanium Films Evaporated onto Clean NaCl Substrates," Journal of Vacuum Science and Technology, vol. 8, No. 1, 1972, 5 pages.
Shuskus, A.J. et al., "Fabrication of Monocrystalline GaAs Solar Cells Utilizing NaCl Sacrificial Substrates," SERI Annual Report, Aug. 1, 1982 through Oct. 14, 1983, a Subcontract Report, 67 pages.
Steinberg, R.F. et al., "Preparation of Epitaxial GaAs Films by Vacuum Evaporation of the Elements," Journal of Applied Physics, vol. 37, 1966, 2 pages.
Tiwari, A.N. et al., "12.8% Efficiency Cu(In,Ga)Se2 Solar Cell on a Flexible Polymer Sheet," Progress in Photovoltaics: Research and Applications, vol. 7, 1999, 5 pages.
Tiwari, A.N. et al., "Flexible CdTe Solar Cells on Polymer Films," Progress in Photovoltaics: Research and Applications, vol. 9, 2001, 5 pages.
Wangperawong, A. et al., "Vapor transport deposition and epitaxy of orthorhombic SnS on glass and NaCl substrates," Applied Physics Letters, vol. 103, 2013, 5 pages.
Yablonovitch, E. et al., "Extreme selectivity in the lift-off of epitaxial GaAs films," Applied Physics Letters, vol. 51, No. 26, 1987, 3 pages.

* cited by examiner

EPITAXIAL ALKALI HALIDE LAYERS FOR III-V SUBSTRATE RECYCLING

CROSS-REFERENCE TO RELATED APPLICATIONS

This application claims priority from U.S. Provisional Patent Application No. 63/291,689 filed on Dec. 20, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

III-V substrates are a platform for high efficiency optoelectronic devices. However, these substrates are expensive, and this cost is one of the main hinderances to widespread adoption, especially for devices which require large areas such as solar cells. III-V substrate recycling techniques have been developed and include selective wet-etching of layers using hydrofluoric acid (HF) and mechanical spalling techniques. Both methods require expensive chemical and/or mechanical polishing. In addition to using dangerous HF, the first method also has slow release times, and requires aluminum-containing layers to provide etch-selectivity limiting the useful device structures that can be used. The second method, mechanical spalling, is not as developed and can leave the underlying surface too rough to grow materials, therefore, requiring more frequent polishing steps. Thus, there remains a need for improved methods for recovering and recycling III-V substrates to enable their continued growth in industry and the marketplace.

SUMMARY

An aspect of the present disclosure is a method that includes depositing a first layer onto a substrate, depositing a second layer onto a surface of the first layer, and separating the substrate from the second layer, where the substrate includes a first III-V alloy, the second layer includes second III-V alloy, and the first layer includes a material that includes at least two of a Group 1A element, a Group 2A element, a Group 6A element, and/or a halogen. In some embodiments of the present disclosure, the first III-V alloy may include at least two of indium, gallium, aluminum, arsenic, phosphorus, antimony, bismuth, and/or nitrogen. In some embodiments of the present disclosure, the second III-V alloy may include at least two of indium, gallium, aluminum, arsenic, phosphorous, and/or bismuth.

In some embodiments of the present disclosure, the material of the first layer may include an alkali halide. In some embodiments of the present disclosure, the alkali halide may include at least one of a Group 1A element and/or a Group 2A element and at least one halogen. In some embodiments of the present disclosure, the alkali halide material may include at least one of NaCl, LiBr, $CaF_2$, $BaCl_2$, NaF, and/or $NaCl_xF_y$. In some embodiments of the present disclosure, the material of the first layer may include at least one of a Group 6A element and at least one of Group 1A element and/or a Group 2A element. In some embodiments of the present disclosure, the material of the first layer may include at least one of MgO, CaO, and/or BeSe.

In some embodiments of the present disclosure, the depositing of the second layer may be performed using a hydride vapor phase epitaxy (HVPE) system. In some embodiments of the present disclosure, the depositing of the second layer may be performed using a vacuum depositing system. In some embodiments of the present disclosure, the vacuum depositing system may include a molecular beam epitaxy (MBE) system. In some embodiments of the present disclosure, the method may further include, prior to depositing the second layer, treating the surface of the first layer using an electron beam. In some embodiments of the present disclosure, the depositing of the second layer may be performed in a first chamber of the vacuum depositing system, and the treating may be performed in a second chamber of the vacuum depositing system.

In some embodiments of the present disclosure, the treating may be performed for a first time period between greater than zero seconds and less than or equal to 10 minutes. In some embodiments of the present disclosure, the electron beam may have a power between about 0.1 kV and about 100 kV. In some embodiments of the present disclosure, the electron beam may be provided using a reflection high energy electron diffraction (RHEED) system. In some embodiments of the present disclosure, the depositing of the second layer may be performed, while maintaining the first layer at a first temperature between about 90° C. and about 700° C. In some embodiments of the present disclosure, the depositing of the first layer may be performed while maintaining the substrate at a second temperature between about 20° C. and about 600° C.

In some embodiments of the present disclosure, the method may further include, after the depositing of the second layer, removing the first layer from the substrate and the second layer. In some embodiments of the present disclosure, the removing may be performed by contacting the first layer with a compound in a state that is at least one of a liquid and/or a vapor. In some embodiments of the present disclosure, the compound may include at least one of water and/or an organic compound.

An aspect of the present disclosure is a that includes using an electron beam, treating a surface of a first layer that includes an alkali halide material and depositing onto the treated surface a second layer having a III-V alloy, where the treating and depositing are performed in a single chamber of a molecular beam epitaxy (MBE) system.

An aspect of the present disclosure is a composition that includes, in order, a substrate, a first layer; and a second layer, where the substrate includes a first III-V alloy, the second layer includes a second III-V alloy, and the first layer includes a material that includes at least two of a Group 1A element, a Group 2A element, a Group 6A element, or a halogen.

BRIEF DESCRIPTION OF DRAWINGS

Some embodiments are illustrated in referenced figures of the drawings. It is intended that the embodiments and figures disclosed herein are to be considered illustrative rather than limiting.

FIG. 5.

FIG. 13 illustrates plan view SEM images of GaAs second layers deposited on NaCl after about 3 minutes of total GaAs deposition at 300° C. at (1, top row) low and (2, bottom row) high magnification for representative areas, according to some embodiments of the present disclosure. (a) Area not exposed to RHEED at any point during the growth. (b) Area exposed to RHEED during NaCl deposition and subsequently covered with and additional >20 nm of NaCl prior to GaAs deposition. (c) Area exposed to RHEED for 180 seconds during NaCl deposition and subsequently covered with 4.5 nm of NaCl prior to GaAs deposition. (d) Area exposed to RHEED during the final 90 seconds of NaCl deposition immediately prior to GaAs deposition. Areas exposed to RHEED during the (e) initial, (f) second, and (g) third minute of GaAs deposition. All according to some embodiments of the present disclosure.

REFERENCE NUMERALS

Figure 1:
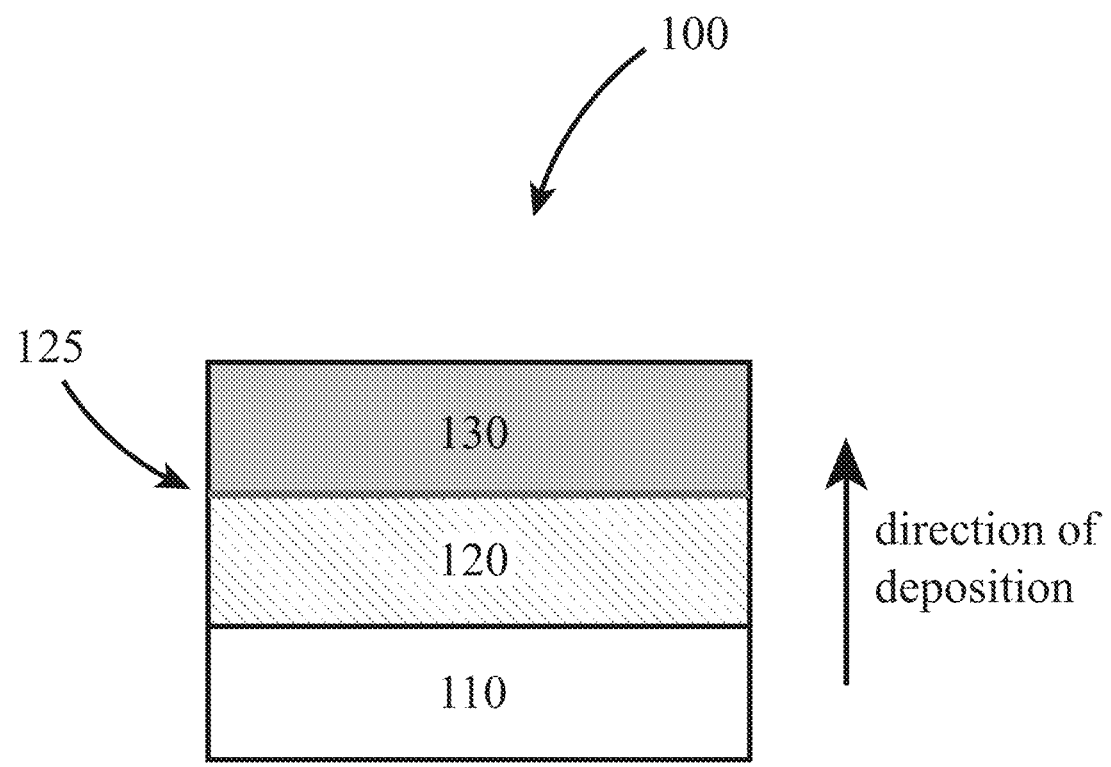
FIG. 1 illustrates a stack that includes a substrate, an alkali halide material (e.g., salt) layer (i.e., first layer), and a second layer (i.e., stack layer), according to some embodiments of the present disclosure.

100 . . . stack
110 . . . substrate
120 . . . first layer
125 . . . surface of the first layer
130 . . . second layer
200 . . . method 210 . . . depositing of the first layer
220 . . . treating of first layer
230 . . . depositing of the second layer.
240 . . . removing of the second layer.
250 . . . further processing of the second layer
260 . . . recycle of the substrate

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to a unique method for recovering III-V substrates used to grow III-V electronic devices, while maintaining the substrates' surface qualities and/or physical properties to enable the recycle and reuse of the substrates. Specifically, methods are described herein for depositing thin, smooth epitaxial alkali halide layers, e.g., NaCl, onto substrates constructed of III-V materials, e.g., GaAs, via vacuum depositing systems such as molecular beam epitaxy (MBE). These alkali halide layers may then function as temporary substrates for subsequent growth of III-V device layers onto the alkali halide layers. Then, once a desired device stack has been manufactured, in some embodiments of the present disclosure, the solid alkali halide layer(s) may be dissolved in a liquid, e.g., water, allowing the device stack to be recovered and transferred to further downstream processing steps, as needed, and enabling the recovery and reuse of the substrate for use in the manufacture of additional III-V device layers and/or devices. As shown herein, the growth and release of an alkali halide layer of NaCl does not significantly damage the original underlying substrate, which should allow for many reuses of the substrate before requiring a polishing step and/or disposal. Additionally, single crystalline III-V material has been successfully deposited onto these temporary substrate NaCl layers.

FIG. 1 illustrates a stack 100 according to some embodiments of the present disclosure. This exemplary stack 100 includes a first layer 120 positioned between a substrate 110 and a second layer 130. As described herein, the first layer 120 may be constructed of an alkali halide material and serves as a temporary substrate. The "alkali" portion may include at least one element from the first column (i.e., Group 1A elements) (e.g., Li, Na, K, Rb, Cs, and/or Fr) and/or second column (i.e., Group 2A elements) (e.g., Be, Mg, Ca, Sr, Ba, and/or Ra) of the periodic table, and the "halide" portion may include at least one halogen (e.g., F, Cl, Br, I, and/or At). In some embodiments of the present disclosure, a first layer 120 may be synthesized using a salt having at least one Group 6A element and at least one halogen. Group 6A elements include oxygen, sulfur, selenium, and tellurium. An example of an alkali halide for constructing the first layer 120 includes NaCl. Other examples of alkali halides that may be used to form a first layer 120 include at least one of NaBr, NaI, KCl, KBr, and/or KI. The first layer 120 of an alkali halide may be deposited onto a substrate 110 constructed of a first III-V alloy, for example GaAs, InP, and/or GaN. Once deposited, a surface 125, e.g., the "top" or outermost surface, of the first layer 120 may be treated with an electron beam, as described in more detail below. This treating step may alter the surface 125 in such a way as to enable the subsequent depositing of the second layer 130 onto the surface 125 of the first layer 120, resulting in, among other things, a better quality second layer 130. Once the second layer 130 has been successfully deposited onto the first layer 120, the second layer 130 may be separated from the substrate 110 by removal of the first layer 120, for example, by dissolving the alkali halide material in a liquid (i.e., water), thereby enabling the recycle of the substrate 110 to produce another stack 100. In some embodiments of the present disclosure, the step of submerging in a liquid may be replaced by a mechanical means; e.g., by simply peeling the two the second layer 130 from the substrate 110. In some embodiments of the present disclosure, a combination of submerging in a liquid with a mechanical means may be used to separate the second layer 130 from the substrate 110.

In some embodiments of the present disclosure, a second layer 130 may be constructed of a III-V alloy that includes at least two of indium, gallium, arsenic, and/or bismuth. For example, a second layer 130 may be constructed of a III-V alloy that includes at least one of GaAs, InGaAs, and/or GaAsBi. In some embodiments of the present disclosure, the first layer 120 constructed of an alkali halide material may include two or more layers constructed of two or more different alkali halide materials. For example, a first layer 120 may include a NaCl layer positioned on a KBr layer. In some embodiments of the present disclosure, a first layer 120 may be constructed having multiple layers, where two or more of the alkali halide layers have substantially different lattice constants. In some embodiments of the present disclosure, the substrate 110 and the second layer 130 may be constructed of substantially the same III-V alloy. In some embodiments of the present disclosure, the substrate 110 and the second layer 130 may be constructed of different III-V alloys.

Figure 2:
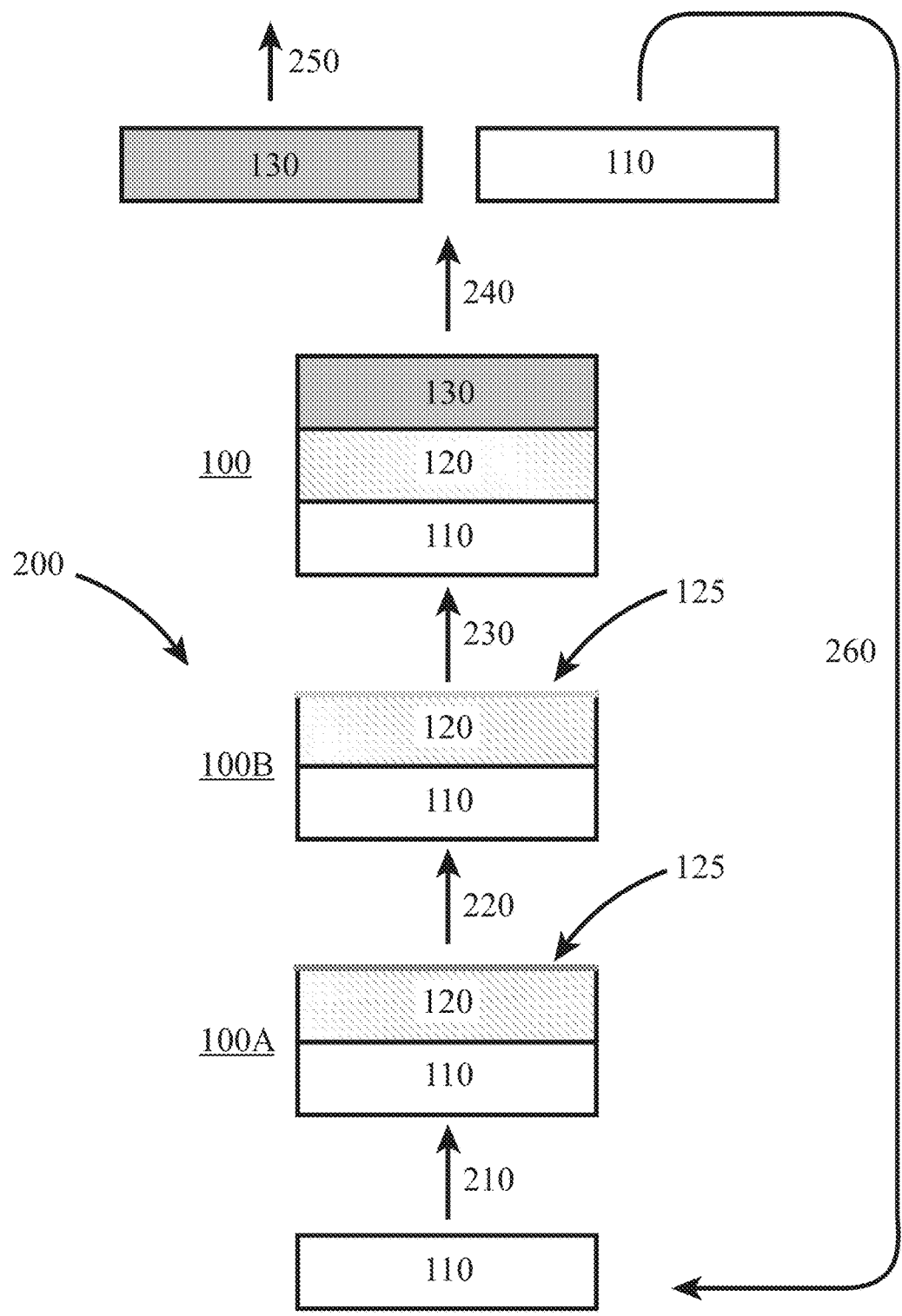
FIG. 2 illustrates a method for producing a stack similar to that illustrated in FIG. 1, according to some embodiments of the present disclosure.

FIG. 2 illustrates a method for manufacturing a stack 100, like that illustrated in FIG. 1, according to some embodiments of the present disclosure. Referring to the bottom of FIG. 2, such an exemplary method 200 may begin with a depositing 210 of a first layer 120 made of an alkali halide material onto a substrate 110, resulting in an intermediate stack 100A, where the second layer 120 has an outer surface 125. The method 200 may then proceed with a treating 220 of the surface 125 of the first layer 120, resulting in a second intermediate stack 100B. As described herein, such a treating 220 step may include subjecting the surface 125 to an electron beam, resulting in an altered and/or modified surface 124, that, among other things, enables improved downstream processing. After the treating 220 of the surface 125 of the first layer 120, the method 200 may then proceed with the depositing 230 of a second layer 130 onto the treated surface 125 of the first layer 120, resulting in the stack 100 as shown in FIG. 1; a stack 100 having a first layer 120 of an alkali halide material, positioned between a substrate 110 made of a first III-V alloy and a second layer 130 made of a second III-V alloy. This final stack 100 may then be processed resulting in the removing 240 of the second layer 130 from the substrate 110, allowing recycling 260 of the substrate to be reused to produce additional stacks/devices. The second layer 130 may then undergo further processing 250; e.g., other semiconductor layers may be deposited onto the second layer 130. As described herein, in some embodiments of the present disclosure, the second layer 130 may be separated from the substrate 110 by immersing the stack 100 into a liquid (e.g., water), resulting in at least the partial dissolution of the first layer 120.

In some embodiments of the present disclosure, at least one of the depositing 210 of the first layer 120 and/or the depositing 230 of the second layer 130 may be performed using a separate deposition technique such as metal organic chemical vapor deposition (MOCVD) or a hydride vapor phase epitaxy (HVPE). In some embodiments of the present disclosure, at least one of the depositing 210 of the first layer 120 and/or the depositing 230 of the second layer 130 may be performed using a vacuum depositing system. In some embodiments of the present disclosure, a vacuum depositing system may include a molecular beam epitaxy (MBE) system. In some embodiments of the present disclosure, at least one of the depositing 210 of the first layer 120, the depositing 230 of the second layer 130, and/or the treating 220 of the surface 125 may be performed in a single location in space; i.e., a single chamber of a vacuum depositing system. In some embodiments of the present disclosure, the depositing 210 of the first layer 120 may be performed in a first location in space of a depositing system and the treating 220 of the surface 125 of the first layer 120 may be performed in a second location in space.

In some embodiments of the present disclosure, a depositing 210 of a first layer 120 onto a substrate 110 may be performed while maintaining the substrate 110 at a temperature between about 20° C. and about 600° C., or between about 100° C. and about 400° C. In some embodiments of the present disclosure, the temperature during the depositing of 210 of the first layer may be maintained at least during the start of growth of the first layer 120 on a surface (not called out with a reference numeral) of the substrate 110. In some embodiments of the present disclosure, the depositing of the first layer 120 onto a substrate 110 may be performed at a pressure between about 1e-11 Torr and about 1e-4 Torr, or between about 1e-9 and 1e-5. In some embodiments of the present disclosure, the first layer 120 may have a thickness between about 1 nm and about 1000 nm, or between about 2 nm and about 300 nm.

In some embodiments of the present disclosure, a treating 220 of the surface 125 of the first layer 120 using an electron beam may be performed for a time period between greater than zero seconds and less than or equal to 10 minutes, or between about 0.1 seconds and about 5 minutes. In some embodiments of the present disclosure, an electron beam used for treating 220 a surface 125 of the first layer 120 may have a power between about 0.1 kV and about 100 kV, or between about 0.1 kV and about 20 kV. In some embodiments of the present disclosure, an electron beam may be provided using a reflection high energy electron diffraction (RHEED) system.

In some embodiments of the present disclosure, a depositing 230 of a second layer 130 may be performed, while maintaining the first layer 120 at a temperature between about 90° C. and about 700° C., or between about 200° C. and about 450° C. In some embodiments of the present disclosure, a depositing 230 of a second layer 130 may be performed while maintaining a pressure between about 1e-9 Torr and about 1e-4 Torr, or between about 1e-6 Torr and about 1e-4 Torr. In some embodiments of the present disclosure, a depositing 230 of a second layer 130 may be performed for a time period between about 1 second and about 30 minutes, or between 15 seconds and 10 minutes. In some embodiments of the present disclosure, a depositing 230 of a second layer 130 may be performed at a rate between about 0.3 nm/min and about 83 nm/min, or between 1 nm/min and 50 nm/min. In some embodiments of the present disclosure, a second layer 130 may have a thickness between about 1 nm and about 1000 nm, or between about 5 nm and about 200 nm.

In some embodiments of the present disclosure, a method 200 may further include, between the depositing 210 of the first layer 120 and the depositing 230 of the second layer 130, heating (not shown) the substrate and the first layer from the temperature used for the first depositing 210 to the temperature used for the second depositing 230. In some embodiments of the present disclosure, during the heating, the alkali halide material used to construct the first layer 120 may be continuously deposited onto the substrate 110. In some embodiments of the present disclosure, a method 200 may further include, after the depositing 230 of the second layer 130, removing 240 the first layer 120 from the substrate 110 and the second layer 130. In some embodiments of the present disclosure, the removing 240 of the first layer 120, resulting in the separating of the substrate 110 from the second layer 130, may be performed by dissolving the alkali halide material making up the first layer 120 in a liquid. In some embodiments of the present disclosure, the liquid may include water or any aqueous solution. Other liquids that may be suitable for the removing 240 of the first layer 120 include an alcohol, such as methanol, ethanol, propanol, and/or butanol. In some embodiments of the present disclosure, the removing 240 step using the liquid may be performed by at least one of a mechanical process, an acoustic process, and/or a heating process. An example of a mechanical means of removing one layer from another is spalling, which includes depositing a stressor layer onto the layers to be separated and a mechanical "spall" is initiated to release the second layer 120 from the substrate 110. An acoustic process for removing 240 includes the use of sound waves, which are impinged onto at least one of the substrate 110 and/or the second layer 120 to initiate a mechanical spall to release the epitaxial layers from the substrate. A method for removing 240 that involves heat may include the rapid heating and/or cooling to initiate a mechanical spall and release the layers from the substrate.

As described herein, molecular beam epitaxy (MBE) was used to deposit alkali halide layers, NaCl, onto GaAs substrates. The NaCl appears to be epitaxially related to the GaAs substrate via observations using reflection high energy electron diffraction (RHEED) and transmission electron microscopy (TEM) measurements. Subsequent heating and exposure to electron beams during the initial deposition of subsequent III-V device layers, e.g., GaAs, resulted in a wide variety of film morphologies ranging from discrete crystalline particles, fully dense and amorphous, porous and polycrystalline, and fully dense polycrystalline and single crystalline materials. As shown herein, the subsequent removal (i.e., 240 removing), by dissolution of a NaCl layer (i.e., 120 first layer) in deionized water, resulted in the successful liftoff of the polycrystalline GaAs device layer within seconds, without damaging the surface of the parent substrate (i.e., 110 substrate), according to some embodiments of the present disclosure.

An Epi930 molecular beam epitaxy (MBE) chamber was used to deposit NaCl layers (i.e., 120 first layer) on GaAs (001)±0.1° substrates. NaCl (5N) was provided by sublimation from a conventional effusion cell and arsenic was provided by a valved cracker source. GaAs substrates were cleaned and oxides removed by heating the substrates to about 620° C. for about 25 minutes under exposure to arsenic before deposition; 300 nm GaAs buffer layers were then grown at 580° C. The GaAs buffer layer was grown on the GaAs substrate in order to clean the surface, both chemically (bury contaminants) and structurally (smooth the surface), and provide a consistent starting place for subsequent growth tests. The substrates were then cooled to about 300° C. in an arsenic atmosphere, after which the arsenic supply was closed, after which the substrate was cooled to the target temperature for the alkali halide deposition step. The deposition of NaCl layers (i.e., first layers) was studied at a temperature between about 100° C. and about 350° C. and the deposition of the subsequent GaAs device layers (i.e., second layers) was studied at a temperature between about 100° C. and about 580° C. Temperature was measured via band-edge thermometry using a kSA BandiT system. RHEED was used to measure the surfaces during growth. Nomarski differential contrast imaging and scanning electron microscopy (SEM) were used to look at surface morphology ex-situ. Cross sectional SEM and transmission electron microscopy (TEM) were used to investigate the growth morphology and epitaxial relationships of the different layers.

Figure 3:
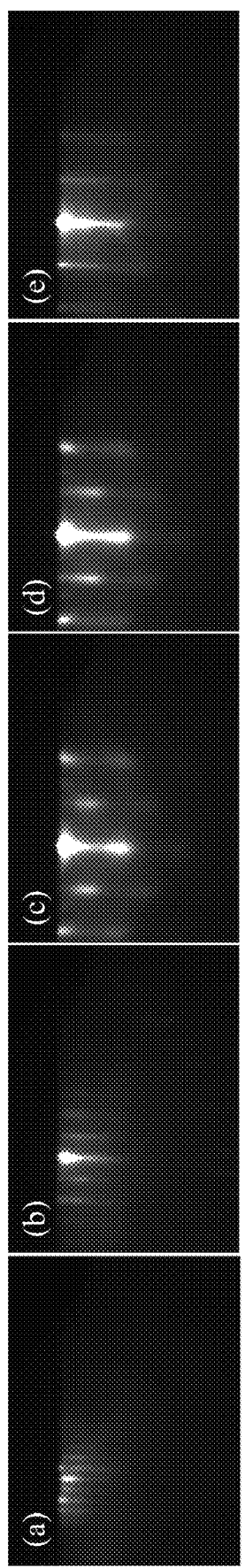
FIG. 3 illustrates reflection high energy electron diffraction (RHEED) images parallel to <1-10> of (a) initial GaAs substrate after a GaAs buffer layer growth at 580° C., at 150° C. (b) just before, (c) after 15 seconds (d) after 1 minute and (e) after 10 minutes of NaCl deposition, according to some embodiments of the present disclosure.

Deposition of NaCl thin films (i.e., first layers) on GaAs substrates: The first step performed was the depositing of a first layer of single crystalline NaCl onto the surface of a GaAs substrate. RHEED was used in-situ to monitor the surface throughout the growth. After a 300 nm GaAs buffer layer was deposited onto the GaAs substrate, while maintaining the substrate at a temperature of about 580° C., the diffraction patterns taken along the [1-10] directions displayed the typical 2×4 reconstruction from the dimerization of As surface-atoms under high As-overpressure (see Panel (a) of FIG. 3) which converted to a symmetric c(4×4) upon cooling (see Panel (b) of FIG. 3). The arsenic supply was closed when the substrate temperature was between about 320° C. and about 400° C. as the RHEED pattern began to go diffuse under the supply of excess arsenic cooling below a temperature of about 320° C. When the temperature cooled to the desired temperature for NaCl deposition ($T_{NaCl}$), for example, about 150° C., the shutter was opened (see Panels (c) through (e) of FIG. 3) and the reconstructions were swiftly replaced with a spotty 1×1 pattern, signifying that the first few monolayers of NaCl were rough. The faint presence of rings was also observed, indicating the presence of initial polycrystallinity. As growth persisted beyond about 3 nm, the rings and spots gave way to a streaky pattern with visible Kikuchi lines, signifying that the material had become very smooth with a single orientation. Additional RHEED images observed while rotating the sample (not shown) revealed 4-fold symmetry of the NaCl layer. Additionally, the ratio of the spacing between the [110] and [100] is √2/2 and align parallel to the [110] and [100] directions of GaAs, respectively, indicative of a cubic symmetric NaCl crystal layer on the GaAs substrate.

Figure 4:
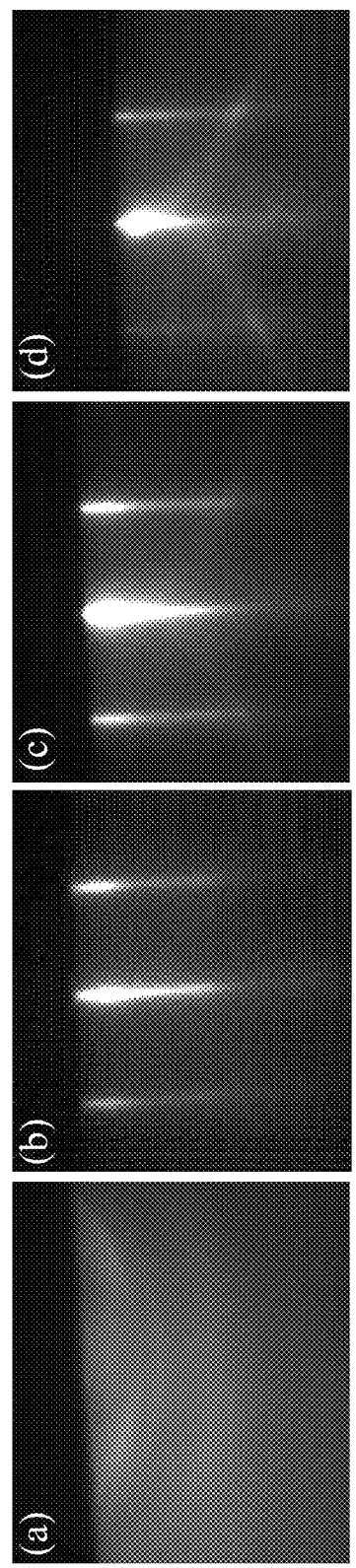
FIG. 4 illustrates RHEED images after 10 minutes of NaCl deposition (resulting in an approximate 30 nm thick NaCl layer) on a GaAs substrate taken along <100> deposited (a) at 100° C. with a small amount of excess As on the surface, and on pristine GaAs surfaces (b) at 100° C., (c) at 150° C., and (d) 175° C., according to some embodiments of the present disclosure.

The effects of varying $T_{NaCl}$ (substrate temperature during NaCl deposition) was also investigated. The resulting RHEED patterns of a nominally 30 nm NaCl layer deposited at different temperatures are shown in FIG. 4. As mentioned previously, if the As-valve was open while the substrate was too cold to desorb excess arsenic, an amorphous arsenic layer would grow. In this case, upon opening of the NaCl shutter, a ring like pattern quickly appeared and did not recover with further NaCl deposition. Blurry spots superimposed on the rings signal some degree of texturing, which in the absence of a crystalline surface, indicates some inherent preferential growth direction. The remaining images of FIG. 4 show NaCl depositions starting on clean and crystalline c(4×4) GaAs surfaces with a chamber pressure less than 7×10⁻⁸ Torr before depositing the NaCl. As the growth temperature increased from about 100° C. to about 175° C., tight streaks became brighter and the Kikuchi patterns also brightened indicating well-organized smooth surfaces. Nucleation of NaCl at temperatures greater than 175° C. was not thoroughly studied, as the presence of the RHEED e-beam had substantial effects on the alkali halide layer, which seems to be more sensitive to destruction at higher temperatures.

Figure 5:
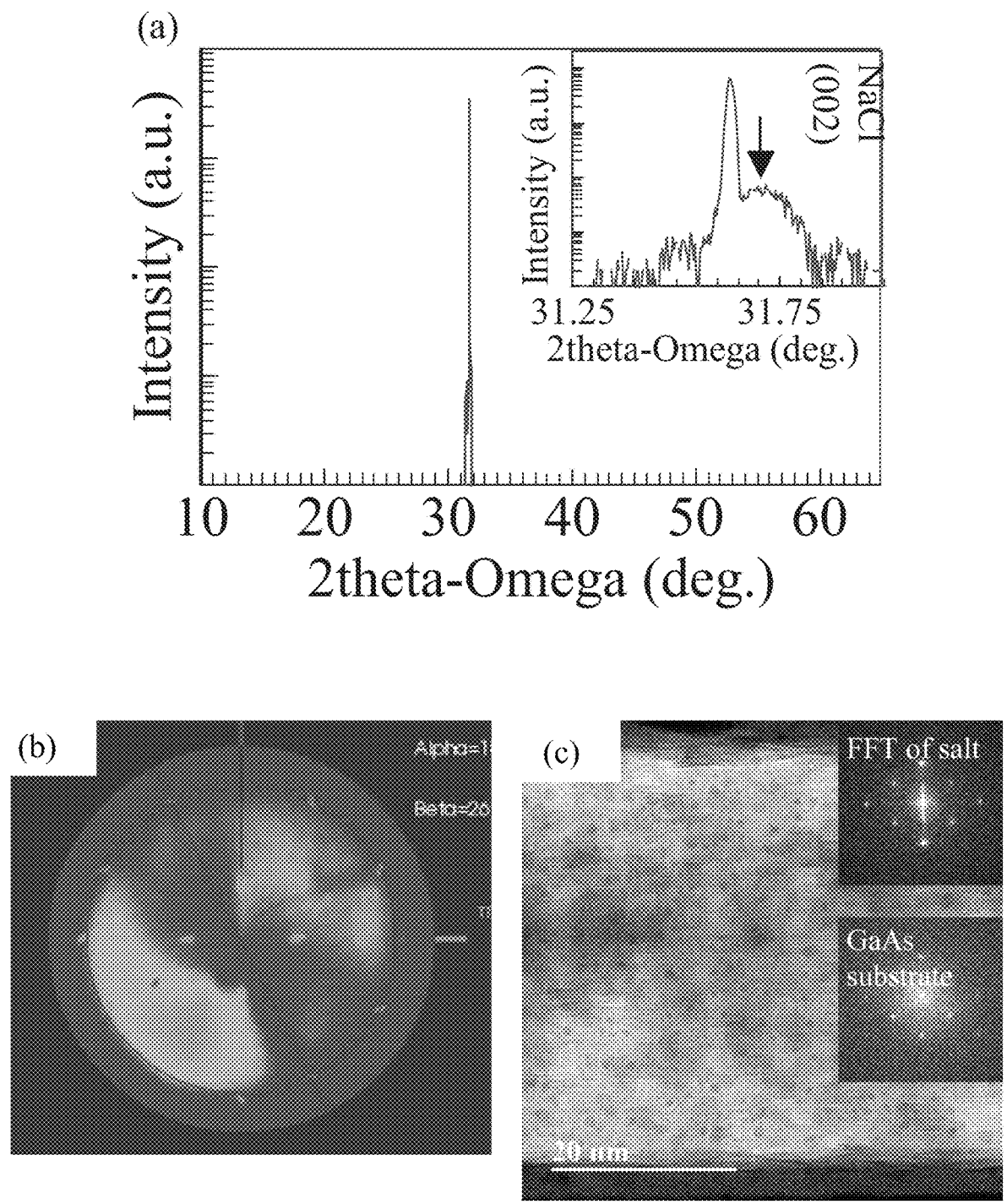
FIG. 5 illustrates (a) wide angle XRD of a NaCl layer, having a thickness of about 80 nm, deposited on a GaAs (001) substrate: inset shows smaller range around substrate peak, (b) a pole figure of the NaCl (222) diffraction, and (c) a transmission electron microscopy (TEM) image of the alkali halide layer on a GaAs substrate, with insets showing separate fast Fourier transforms (FFTs) of the alkali halide and GaAs substrate areas, according to some embodiments of the present disclosure.

An exemplary device constructed using a NaCl layer having a thickness of about 90 nm, which was deposited onto a substrate at a substrate temperature of about 150° C. and a growth rate of about 3 nm/min was removed from the chamber and analyzed using XRD (see Panels (a) and (b) of FIG. 5). Wide angle scans show only (001) oriented NaCl. A high angle shoulder on the GaAs (002) substrate peak corresponds to a fully relaxed NaCl (002) at room temperature. However, a pole figure of the (222) NaCl peaks done on a similar sample shows faint spots for what would be the epitaxial orientation, and additional peaks which correspond to something between (221) and (223). These planes do not diffract strongly, so are not observable in the wide-angle scan. High resolution STEM was performed on a number of samples, and Fast Fourier transforms (FFTs) of the NaCl and GaAs regions show an epitaxial relationship and nearly identical lattice constants (see Panel (c) of FIG. 5). The dark spots present in the microscopy image are artifacts resulting from damage induced by the electron beam during acquisition. It is worth noting that a NaCl layer is not completely stable in air. Thus, for longer XRD scans (such as the pole figure) and transport to the microscopy laboratory, the samples were capped with GaAs material to protect the NaCl layers from degradation.

Figure 6A:
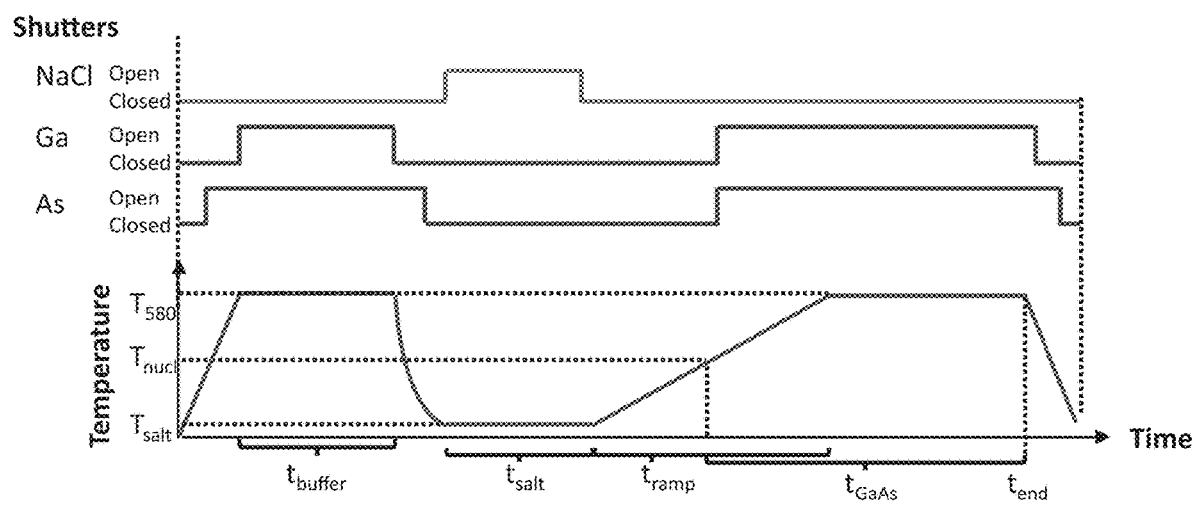
FIGS. 6A-6C illustrate growth schematics showing shutter positions and growth temperatures for the growth of the samples illustrated and discussed in FIGS. 4 and 11.
Figure 6B:
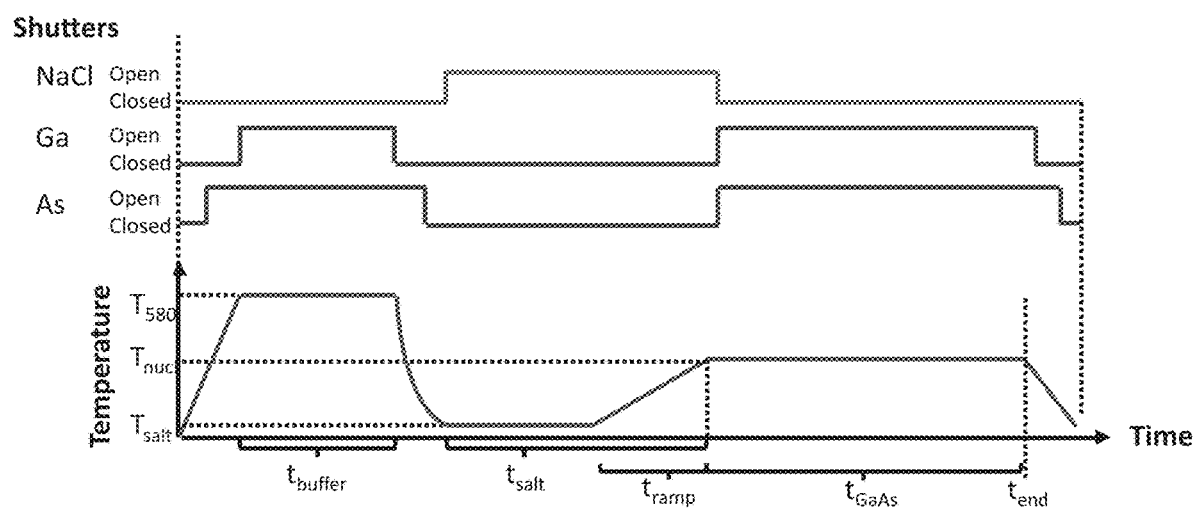
Figure 6C:
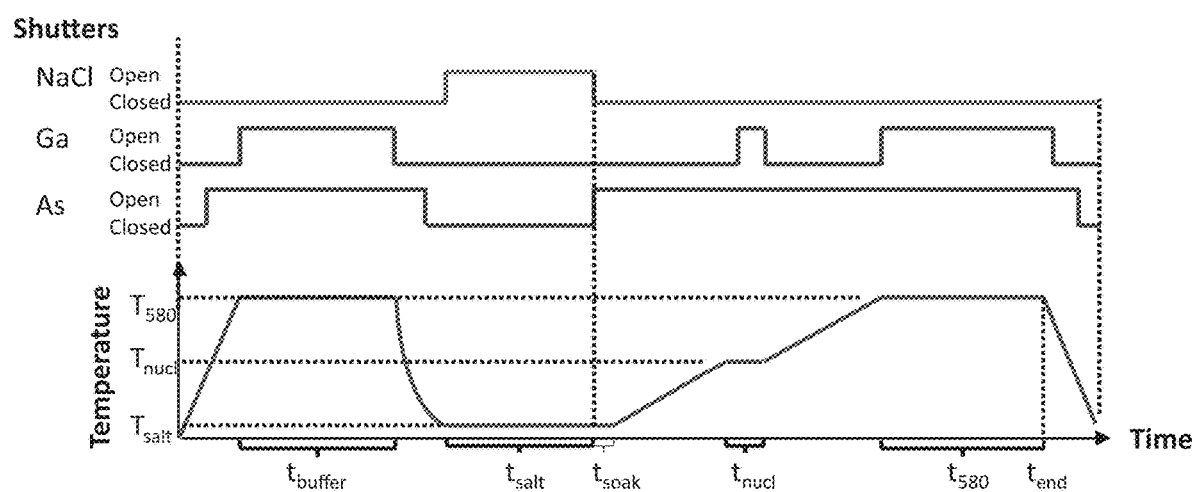

Deposition of GaAs on epitaxial NaCl thin films: The subsequent deposition of GaAs layers (i.e., second layer) on NaCl thin films (i.e., first layer) was carried out in the same chamber without any vacuum break. First, the effect of the temperature at which GaAs was nucleated ($T_{nucl}$) on the NaCl layer was studied. A schematic of this growth process is given in FIGS. 6A-6C. The temperature $T_{nucls}$ varied in the studies while $T_{580}$ represents 580° C. The buffer growth time (tblifter) was 9 minutes in all cases, and the As shutter times were opened prior to and closed after the Ga as temperature ramped, to maintain an As stabilized surface. The salt (e.g., NaCl) deposition time ($t_{salt}$) was varied between studies, and sometimes persisted into the time taken to ramp temperature ($t_{ramp}$) to the GaAs growth temperature; this time was always chosen to give a ramp rate of 20° C./min. The GaAs deposition time ($t_{GaAs}$) was broken into two parts, as shown in FIG. 6C, a lower temperature nucleation time ($t_{nucl}$) of 3 minutes and a deposition time at 580° C. ($t_{580}$) of 9 minutes. All according to some embodiments of the present disclosure.

Figure 7:
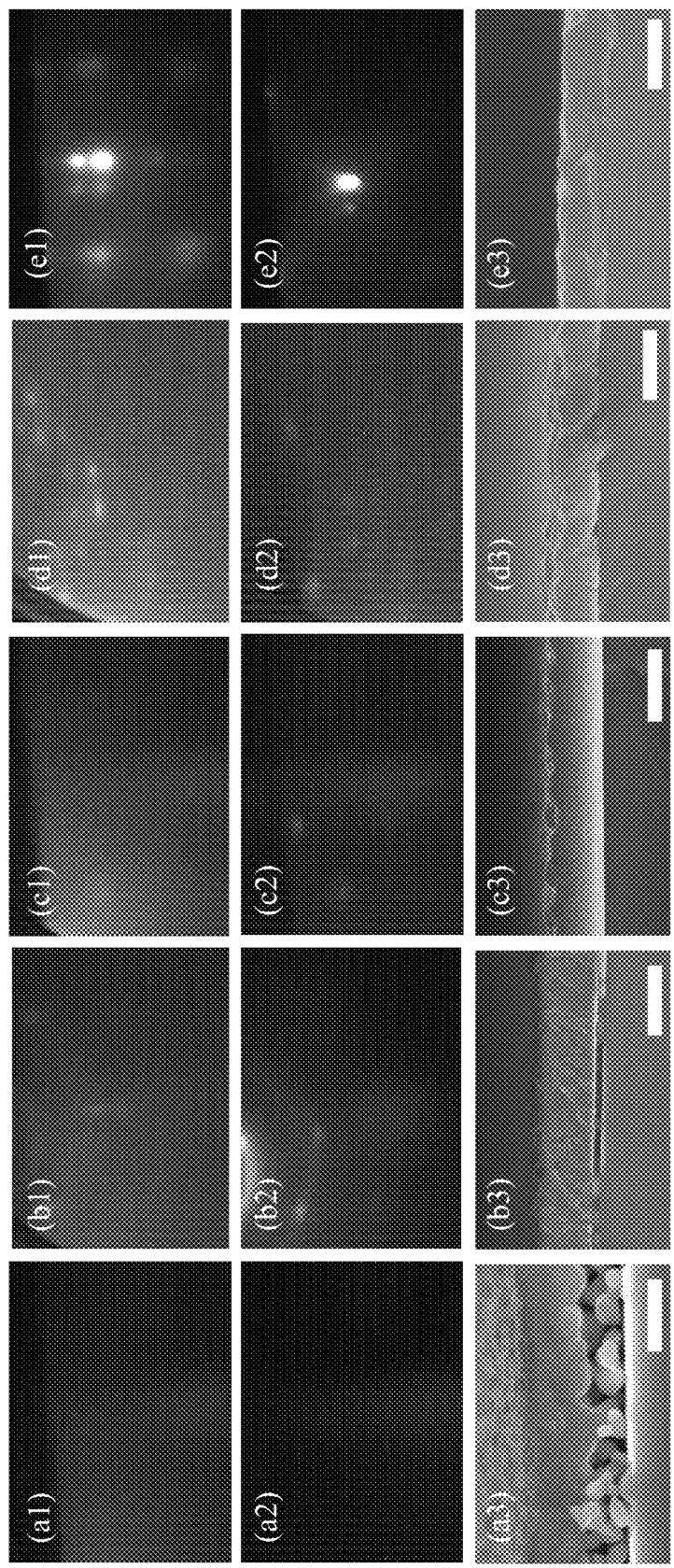
FIG. 7 illustrates RHEED images taken along <100> (1, top row) during the initial and (2, middle row) final times of GaAs deposition and (3, bottom row) corresponding cross-sectional SEM of 30 minutes of NaCl layers initializing the growth of the GaAs second layers at a temperature of (a) 100° C., (b) 200° C., (c) 250° C., (d) 325° C., and (e) 430° C. and depositing continuously while increasing the temperature to 580° C., according to some embodiments of the present disclosure. Scale bars are 600 nm.

After the growth of a buffer layer (of GaAs on the GaAs substrate) at high temperature, nominally 90 nm of NaCl was deposited on the GaAs buffer layer at about 100° C. The NaCl shutter was then closed, and the temperature was increased at a rate of 50° C./min. GaAs deposition (~33 nm/min) was started at $T_{nucl}$ and continued while ramping the temperature to about 580° C. RHEED patterns at the onset and at the end of growth are shown in FIG. 7 with corresponding cross section SEM images from a series of growths. The additional spots located to the left of the primary and first order spots in this figure are artifacts of the incident RHEED beam, and not surface reconstructions.

When GaAs deposition was started at about 100° C. (see Panel (a) (first column) of FIG. 7) the RHEED pattern became diffuse very quickly, signifying a lack of crystalline order. The pattern darkened upon continued growth and heating, as even diffuse reflections were blocked. This is likely due to the increased surface roughness and spontaneous delamination of the film from the substrate. Cross sectional SEM reveals an extremely porous interface with a coalesced top layer. Ex-situ TEM measurements (not shown) reveal the smaller particles between the substrate and film to be crystalline, with the overlayer material constructed of a dense polycrystalline film with grains having a characteristic length of about 100 nm. This exemplary device resulted an initial ~90 nm GaAs layer deposited on the NaCl layer with a thickness of about 90 nm at the starting temperature of about 100° C., prior to additional heating to 580° C. If the temperature was ramped at the instant that GaAs growth was initiated (as it was with all other samples illustrated in FIG. 7) the entire GaAs layer would delaminate while in the growth chamber.

Figure 8:
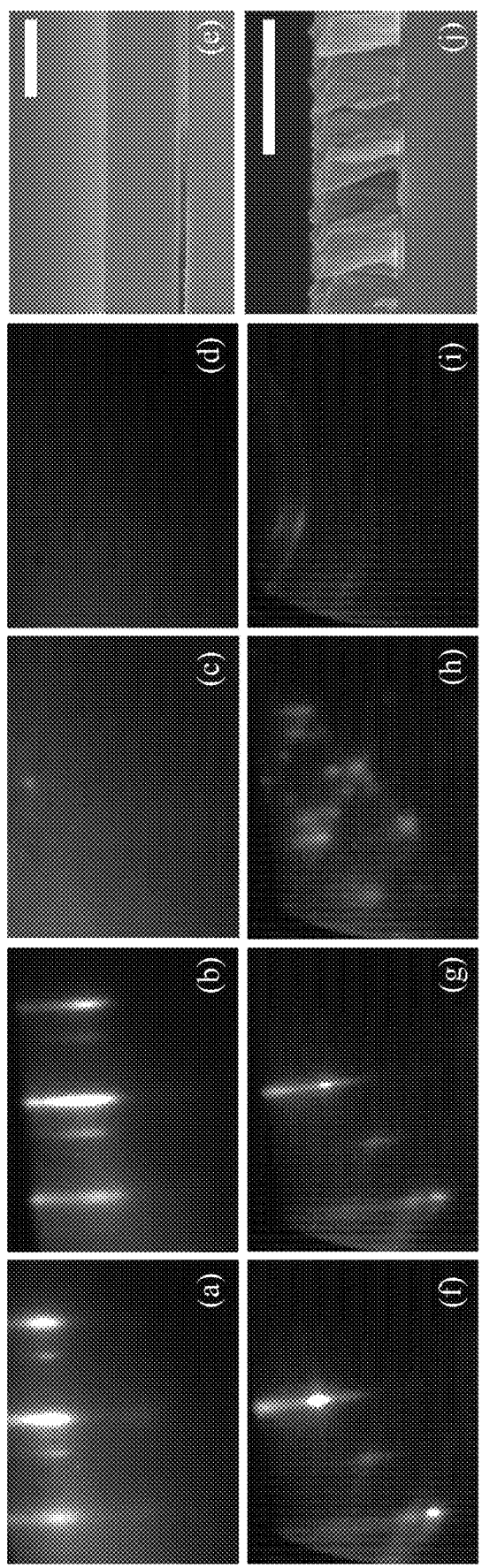
FIG. 8 illustrates RHEED images (a) taken along the <100> after 10 minutes and (b) 30 minutes of NaCl deposition at 100° C. just prior to, (c) after 10 seconds, and (d) after 9 minutes, exposure to Ga and As and (e) a corresponding cross-sectional SEM image of the growth. RHEED images (f) taken along the <110> after 10 minutes of NaCl deposition at 100° C. and (g) upon heating to 250° C. just prior to, (h) after 10 seconds, and (i) after 9 minutes, exposure to Ga and As and (j) a corresponding cross-sectional SEM image of the growth, according to some embodiments of the present disclosure. Scale bars in the SEM images are 600 nm.

Additionally, if the temperature was not increased at all, the GaAs layer (i.e., second layer) remained smooth, but fully amorphous and As-rich (see FIG. 8). To look into the structure of purely low-temperature deposited GaAs onto NaCl, samples similar to those illustrated in FIG. 4 and discussed above were grown at low temperatures but without heating or continuous growth of a GaAs overlayer with heating to a temperature of 580° C. The RHEED again suggests that the NaCl layer was near single crystalline and, aligned with the substrate, and smooth post deposition. The extra set of dimmer spots to the left of the main reflections are artifacts of the incoming RHEED beam, and not reconstructions. Deposition of GaAs at 100° C. shows the RHEED pattern going diffuse early and remained unchanged (see Panels (c) and (d) of FIG. 8). However, unlike the sample shown in Panel (a) of FIG. 4, because this sample was not heated, a dense film with sharp interfaces is observed (see Panel (e) of FIG. 8). TEM and energy-dispersive x-ray spectroscopy (EDX) measurements (not shown) revealed that this deposited material was completely amorphous and As-rich. As shown in Panels (f-j) of FIG. 8 the RHEED pattern remains relatively unchanged when heating to 250° C. (see Panel (g) of FIG. 8), similar to what was discussed previously. However, without the continuous heating, the RHEED transitioned from a streaky NaCl surface to showing many spots and chevrons (see Panel (h) of FIG. 8). First, the transition to a spotted RHEED indicates the formation of a three-dimensional surface. The chevrons passing through the first order spots viewed from the [110] directions suggest GaAs islands assumed a pyramidal shape with {111} facets. Extra spots symmetric about the primary and first order reflections also appeared very early on in the GaAs deposition indicating the presence of twinning along the <111> directions. As the growth continued, this pattern faded and was replaced with rings with diffuse spots (see Panel (i) of FIG. 8) similar to that observed during crystallographically textured nanowire formation. SEM of this sample (see Panel (j) of FIG. 8) shows complete coverage of a NaCl layer with material consisting of densely packed but discrete columnar grains. This is in stark contrast to what is illustrated in Panel (c) of FIG. 4 where growth was initialized at the same temperature, but continuously heated to 580° C.

Additional samples (not shown) showed that changing the thickness of the GaAs layer (i.e., second layer) initially deposited at about 100° C. resulted in proportional changes in the thickness of porous sections of the GaAs layer. However, the coalesced top region remained similar in thickness, and lacked any observed improvements in the crystallinity. Thus, one may assume that the porous structure was a result of the low-temperature, As-rich, amorphous deposition and the coalesced layer was due to the growth at elevated temperatures.

As shown herein, a porous interface can be avoided by increasing the temperature ($T_{nucl}$) at which the GaAs layer was initially grown (i.e., nucleated) to a range between about 200° C. and about 250° C. In both cases the RHEED data developed a spotty ring pattern as GaAs was first deposited, which persisted throughout the depositing step. SEM shows the presence of a smooth NaCl layer (i.e., first layer) having a thickness of about 70 nm, which was maintained beneath a fully dense ~0.500 nm thick GaAs layer (i.e., second layer). Ex-situ TEM and electron backscatter diffraction (EBSD) measurements reveal that these films were polycrystalline, in agreement with the RHEED observations. If the NaCl film was heated to temperatures greater than about 300° C. prior to initial depositing of the GaAs layer (see Panels (d) and (e) of FIG. 7), the RHEED data during GaAs deposition turned spotty within seconds, indicating initial Volmer-Weber growth. By the end of the GaAs deposition, the pattern showed spots with chevrons indicating {111} surface facets. However, SEM measurements no longer indicated the presence of a NaCl layer (i.e., first layer). Instead, large gaps between the substrate and a rough GaAs surface layer were observed. As the $T_{nucl}$ was increased, the large gaps become smaller pores, and eventually disappeared altogether. When the NaCl effusion cell temperature was operated at about 480° C., the NaCl layer (i.e., the first layer) began to rapidly decompose as the sample was heated above 300° C.

RHEED observations indicate GaAs growth initially proceeds three-dimensionally, with the formation of discrete islands (not a fully coalesced layer). This results in incomplete coverage of the NaCl until the islands coalesce together. This enables the NaCl to continuously desorb during the depositing of the GaAs layer and was especially true at higher temperatures where the nucleation of islands was slower. At about 300° C. some GaAs was seeded on the NaCl before desorbing, but not quickly enough to fully cover the NaCl layer and portions of the NaCl layer was removed by the time the islands coalesced, leaving behind large voids. By delaying GaAs deposition until a temperature of about 430° C. was reached, most of the NaCl had already desorbed from the surface of the substrate. It is likely that by this point the NaCl layer (i.e., first layer) was either very thin, or completely gone, and most of the initial GaAs device layer (i.e., second layer) formed on the surface of the GaAs substrate. Any little remaining NaCl escaped through pinholes or gaps between GaAs islands and the result was a final GaAs layer defined by a rough homoepitaxy. XRD and TEM measurements reveal that the GaAs layers (i.e., second layer) having a persistent alkali halide layer or voids ($T_{nucl}$<430° C.), were polycrystalline. However, if similarly deposited NaCl was heated to 580° C. prior to depositing any GaAs (not shown), the NaCl was completely desorbed. In this case the RHEED patterns remain very streaky, regained the typical reconstructions observed with MBE growth, and cross-sectional SEM images show no evidence that a NaCl layer was ever deposited. This suggests that any NaCl remaining on a substrate may be thermally cleaned, and regrowth, e.g., of alkali halide layers and III-V device layers on the resultant treated substrates is possible.

Higher GaAs deposition temperatures: Investigation of the depositing of a GaAs layer (i.e., second layer) on a NaCl layer (i.e., first layer) at temperatures greater than 300° C. should consider the loss of NaCl by desorption during the heating process. To combat this desorption, a new growth scheme was tested (see FIGS. 6A-6C) where the initial NaCl deposition time ($t_{NaCl}$) at $T_{NaCl}$=110° C. was increased up to 180 minutes. Additionally, now the NaCl shutter was left open while heating up to the desired GaAs growth temperature ($T_{nucl}$). The temperature was then held steady for the entirety of GaAs depositing step of the GaAs device layer (i.e., second layer) onto the NaCl layer ($t_{GaAs}$=9 min).

Figure 9:
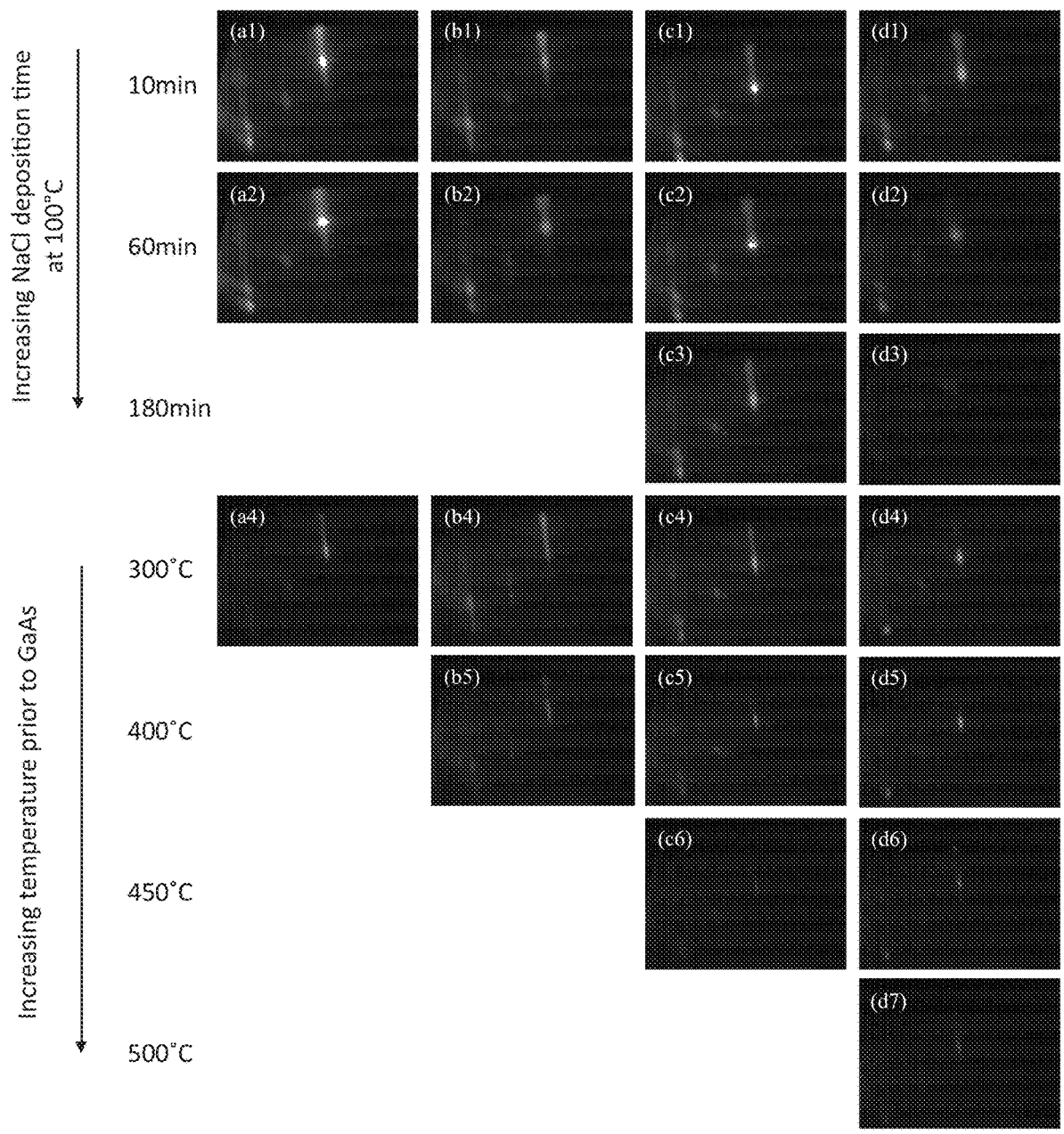
FIG. 9 illustrates additional RHEED patterns along the <110> for samples illustrated in FIG. 5 consisting of salt deposited for various times at 100° C. and capped with GaAs at various temperatures, according to some embodiments of the present disclosure.

RHEED images of the NaCl surface during deposition and heating to the growth temperature shown in FIG. 9, revealed little change after >180 minutes of NaCl deposition (>2 μm) thick. Any dimming of the pattern seen in the thicker alkali halide depositions recovered somewhat upon heating of the GaAs/NaCl to 300° C. However, heating beyond 300° C. transitioned to more spotty and dimmer patterning signifying that the NaCl surface had roughened. Referring again to FIG. 9: Panel (a) 72 minutes of salt capped at 350° C., Panel (b) 74.5 minutes of salt capped at 400° C., Panel (c) 197 minutes of salt capped at 450° C., Panel (d) 199.5 min of salt capped at 500° C. RHEED images shown: in row (1) 10 minutes, row (2) 60 minutes, and row (3) 180 minutes into NaCl deposition at 100° C. (where applicable) and of the NaCl surface with continuing NaCl deposition upon heating to row (4) 300° C., row (5) 400° C., row (6) 450° C., and (7) 500° C. Thick NaCl was first achieved by increasing the deposition time using a growth rate of ~3 nm/min at 110° C. using a beam equivalent pressure (BEP) of ~7.3e-8 torr and for growth temperatures up to 450° C. To achieve a persistent NaCl layer with growth of GaAs at 500° C. in a reasonable amount of time, the BEP of NaCl was increased to 4e-7 torr and NaCl was deposited for 180 minutes at 100° C. (plus ~19.5 minutes ramping from 100-500° C.). Neglecting any desorption, this would be equivalent to ~2.4 µm. In this case, of higher deposition rate, the RHEED pattern was slightly dimmer during the growth. Whether this is due to the higher growth rate, or increased film thickness is not known. However, the pattern began to brighten as the temperature was increased. This could possibly be attributed to a slight annealing of the layer at temperatures <300° C. before the NaCl layer started to desorb. In all cases, the RHEED pattern began to dim at >300° C. This may be due to the increasing desorption and roughening of the surface.

RHEED patterns of samples where the GaAs layer (i.e., second layer) was deposited at a temperature, $T_{nucl}$, less than about 450° C. showed spot shadows and chevrons within the first ~10 seconds of deposition. However, at $T_{nucl}$=500° C. it took nearly a full minute to display a similar RHEED pattern, and the RHEED pattern during initial growth remained streaky (see Panel (e1) of FIG. 10). Faint rings may be present at the lowest nucleation temperature, but at 350-450° C. no initial rings were observed. Instead, complex patterns consisting of chevrons and shadow spots are evident. These shallow angle chevrons when viewing along this <110> direction correspond to {111} faceting of GaAs. The extra set of spots symmetric about the primary reflections are expected to be due to twins, likely rotations about the {111}.

Figure 10:
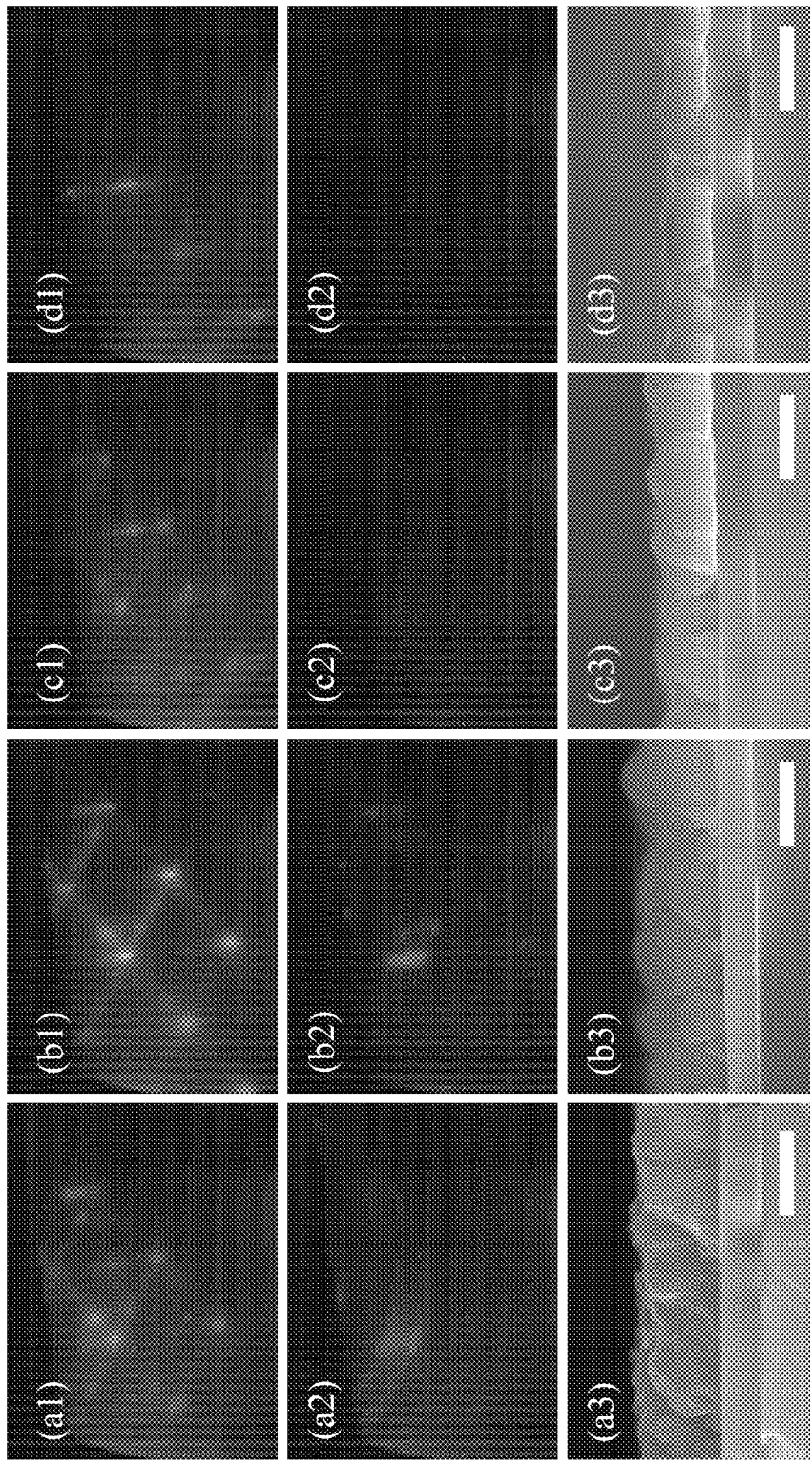
FIG. 10 illustrates RHEED images of (1, top row) initial and (2, middle row) final GaAs second layers deposited on NaCl layers and (3, bottom row) the corresponding SEM images of samples with NaCl deposition beginning at 110° C. and continuously increasing until initializing the GaAs cap at (a) 350° C., (b) 400° C., c) 450° C., d) 500° C., according to some embodiments of the present disclosure. Scale bars are 300 nm.

As the growth temperature used during the depositing of the GaAs layer was increased, the RHEED pattern at the end of the GaAs deposition became steadily more diffuse (see Panels (a2)-(d2) of FIG. 10) which may be due to increasing large scale surface roughness. At $T_{nucl}$=350° C. strong ring-like patterns are observed indicating a large degree of polycrystallinity. However, spots are also observed, especially evident at the lowest temperature growth, indicating some degree of texture. Growth at $T_{nucl}$=400° C. resulted in a weaker ring like pattern and is mostly spotty and quite dim indicating a very rough film, but something not as polycrystalline. It was not possible to discern a pattern at the end of the growth of GaAs layers for depositing temperature between about 450° C. and about 500° C.

SEM images of these samples (see Panels (a3)-(d3) of FIG. 10) reveal that the GaAs layer deposited at 350° C. was fairly dense and approximately equal to the target thickness of about 300 nm. As the GaAs layer depositing temperature was increased, the growth seemed to trend toward the formation of discrete faceted islands, in agreement with the RHEED observations from the early portions of the growth. At the highest temperature the islands were smaller (a thickness of about 190 nm), only about 60% of the targeted thickness. The reason behind this reduction in thickness, or apparent growth rate, with increasing temperature is not fully understood. It is possible that the rapid desorption of the NaCl surface at these higher temperatures creates chemical complexes, such as $GaCl_3$, which are more volatile and could prevent further growth of the GaAs layer or that impinging Ga and As atoms have difficulty remaining on such an actively desorbing surface.

Figure 11:
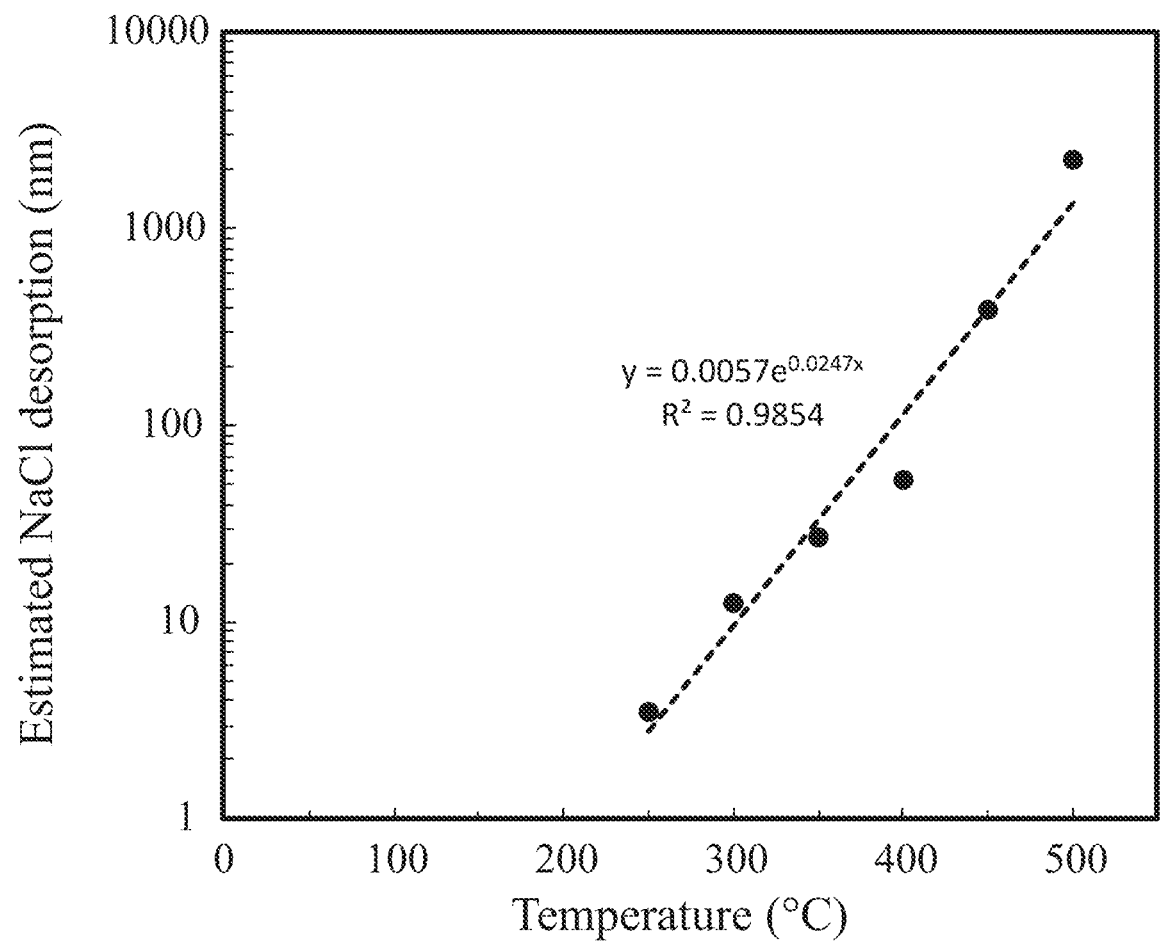
FIG. 11 illustrates alkali halide desorption as a function of the initial deposition temperature of GaAs second layers onto the NaCl layers, according to some embodiments of the present disclosure.

While the estimated and observed thickness of NaCl was similar when capped with GaAs at lower deposition temperatures ($T_{nucl}$<300° C.), to protect the NaCl for analysis as described above, they began to strongly diverge as temperature increased. FIG. 11 shows that an initial NaCl thickness needed to persist until the end of growth increases exponentially as the GaAs nucleation temperature is increased, similar to the temperature dependence of desorption rates. In actuality, the desorption rate of the NaCl is temperature dependent. But for the example where GaAs deposition was not initiated until the substrate and NaCl layer reached about 500° C., lower and upper bounds on the desorption rate can be made by making two assumptions: the NaCl decomposition occurs (1) over the entire 20 minutes at which the sample is >100° C. or (2) exclusively during the 9 minutes of growth of GaAs on NaCl at 500° C. These would result in an average desorption rate of the NaCl layer between about 113 nm/min and about 250 nm/min. This desorption rate is 3.4-7.5× the deposition rate of GaAs used in this study, presenting an obvious challenge for achieving growth at typical GaAs deposition temperatures. The assumption is made here that NaCl begins desorbing the moment NaCl deposition ends and the sample is heated. In this example, it takes about 11 minutes to heat the sample from 100° C. to 500° C. and then it remains at 500° C. during the GaAs deposition for about 9 minutes, resulting in a total time of about 20 minutes during which the NaCl could desorb. Since, for this example, the NaCl did not show evidence of desorption until above 300° C., this provides a lower bound on the average desorption rate because it averages over a longer time period than actually occurs for NaCl desorption.

Figure 12:
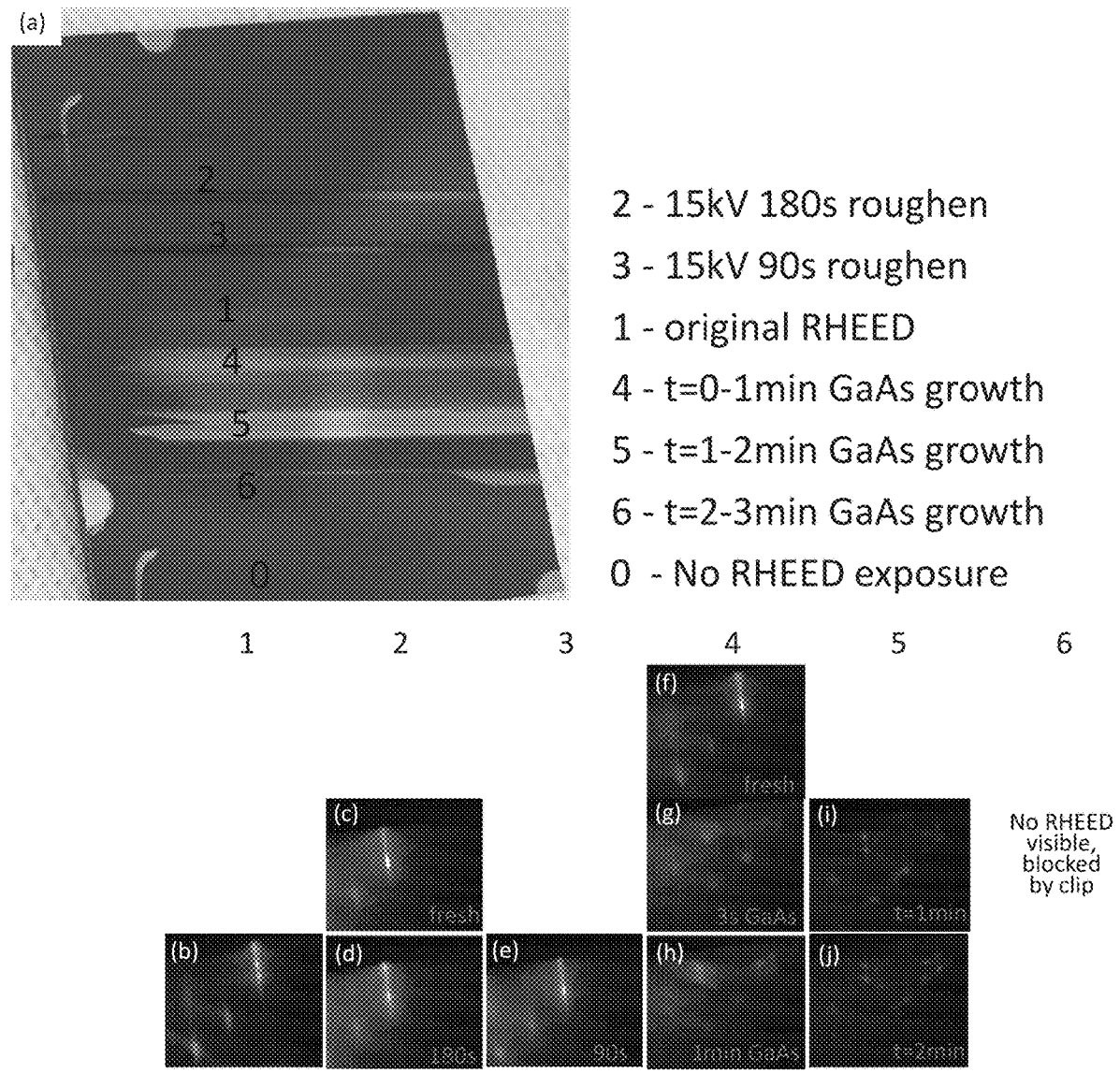
FIG. 12 illustrates (a) an image of a sample after removal of the chamber showing distinct lines from exposure to the RHEED beam during different portions of the growth (labeled 0-6) and (b) RHEED patterns from the different stages of growth in regions 0-6, according to some embodiments of the present disclosure.

The Effect of RHEED on GaAs/NaCl growth: As mentioned above, RHEED is an important tool for in-situ observation, but as discovered during these studies, the presence of the electron beam during growth actively affects the growth in some way. In an attempt to elucidate the effects of the presence of the electron beam a sample was grown where the electron beam was moved across the surface at different points during the growth. An image of the marks left by the RHEED beam on this sample and discussion of the RHEED patterns are illustrated in FIG. 12. This figure contains details of the sample from FIG. 10, for a 3 minute GaAs deposition onto NaCl at 300° C. There are distinct color differences (illustrated here in gray-scale) from the presence of the RHEED beam at different portions of the growth. Areas exposed prior to GaAs deposition look similar, while the three regions at different points during the GaAs growth have different colors. Area 0 has no RHEED pattern as it was never exposed, and Area 6 was blocked by a clip used to hold the sample in place. However, there was an area near the edge of the sample where the clip no longer shadowed the beam that was used for the plan-view SEM. Panel (b) of FIG. 12 shows the pattern after about 10 minutes of NaCl deposition at 110° C. AT this point the RHEED was moved to the edge of the sample and turned off while heated (under continuous NaCl exposure). Panel (c) of FIG. 12 shows the pattern of a fresh area of NaCl (during deposition) at 300° C. which is brighter. Under continuous growth, it takes ~3 minutes for the RHEED pattern to begin to go spotty (see Panel (d) of FIG. 12). At this point the beam was moved to position 3. The pattern after holding the beam at Area 3 for 90 seconds is illustrated in Panel (e) of FIG. 12. Then the beam was moved to area 4 (see Panel (f) of FIG. 12), which looks bright and streaky. GaAs deposition began immediately. The patterns after 3 seconds and 1 minute show organized spots and spotty rings, respectively (see Panels (g, h) of FIG. 12). This signifies that the growth started oriented but three dimensional, and eventually became a textured polycrystalline after about 1 minute. The beam was then moved to area 5. As shown in Panel (i) of FIG. 12, the appearance is distinctly different than the previous location that was exposed the entire first minute. The new area is much less polycrystalline, showing the chevrons and shadow spots discussed in the main text. But after a minute of deposition rings started to appear again, signifying that the growth results in a more polycrystalline material with the presence of the RHEED beam.

Figure 13:
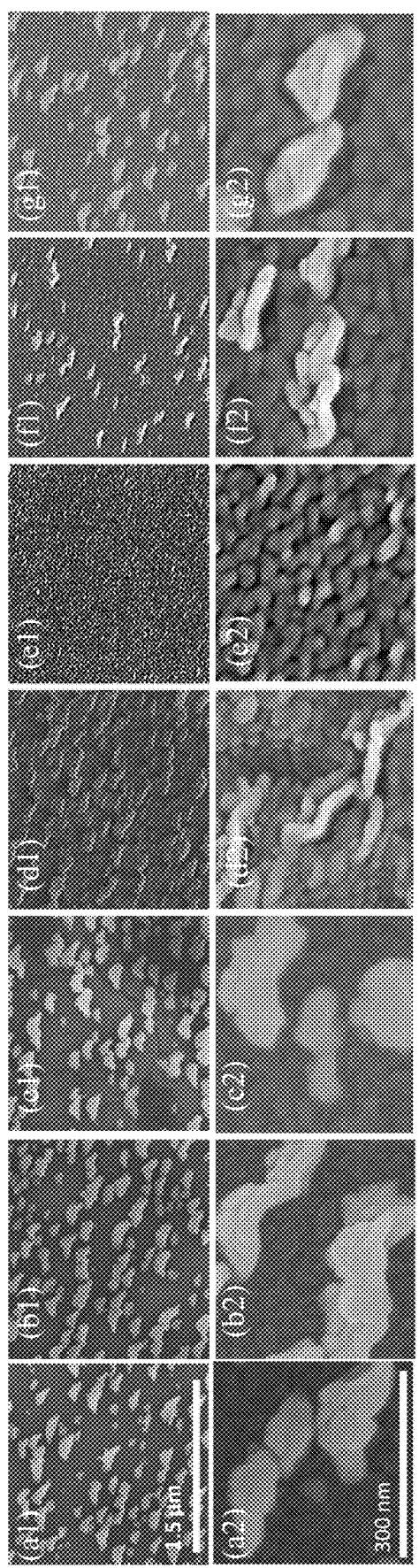
FIG. 13, corresponding to FIGS. 6A, 6B, and 6C, respectively, according to some embodiments of the present disclosure.

The growth process was similar to that described above: 10 minutes of NaCl deposition at 100° C. and continuously while ramping to a target temperature of about 300° C. for the GaAs depositing step. FIG. 13 illustrates a plan view of SEM images of seven distinct RHEED exposed areas (REAs) on this sample, with varying degrees and time of exposure. In the first three cases (see Panels (a-c) of FIG. 13) there was either no RHEED exposure or fresh NaCl was deposited over an exposed area, and the resulting images look very similar. There is a similar density of lighter islands contrasting against a dark background. The long axes of the light islands are nearly parallel to the <110> direction. For these regions, this dark area is NaCl. This was inferred from the continuous degradation and movement of this surface under the presence of a tightly focused electron beam in the SEM. The difference in smoothness can be seen between the low and high magnification images, where it was impossible to acquire a high magnification image without roughening the NaCl layer.

In the case of exposure immediately prior to (but not during) the GaAs deposition (see Panel (d) of FIG. 13), the morphology of both regions is distinctly different. The darker region no longer degrades under the presence of the SEM electron beam and shows some larger almost scale-like undulations. The lighter regions are also thinner than in the previous case, but still have similar directionality as the previous cases.

Figure 14A:
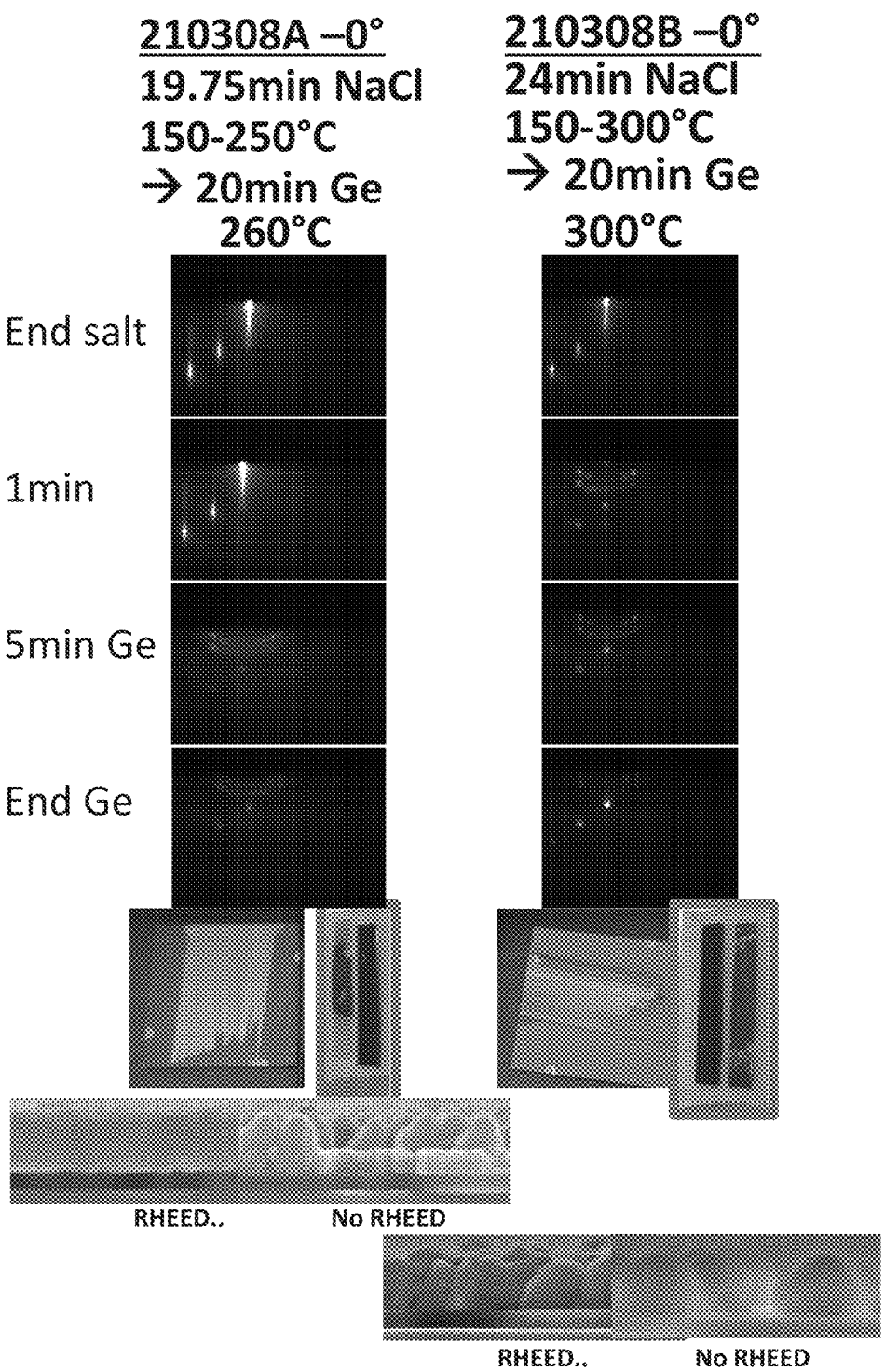
FIGS. 14A-14C illustrate results from Ge deposition experiments completed with RHEED, according to some embodiments of the present disclosure.
Figure 14B:
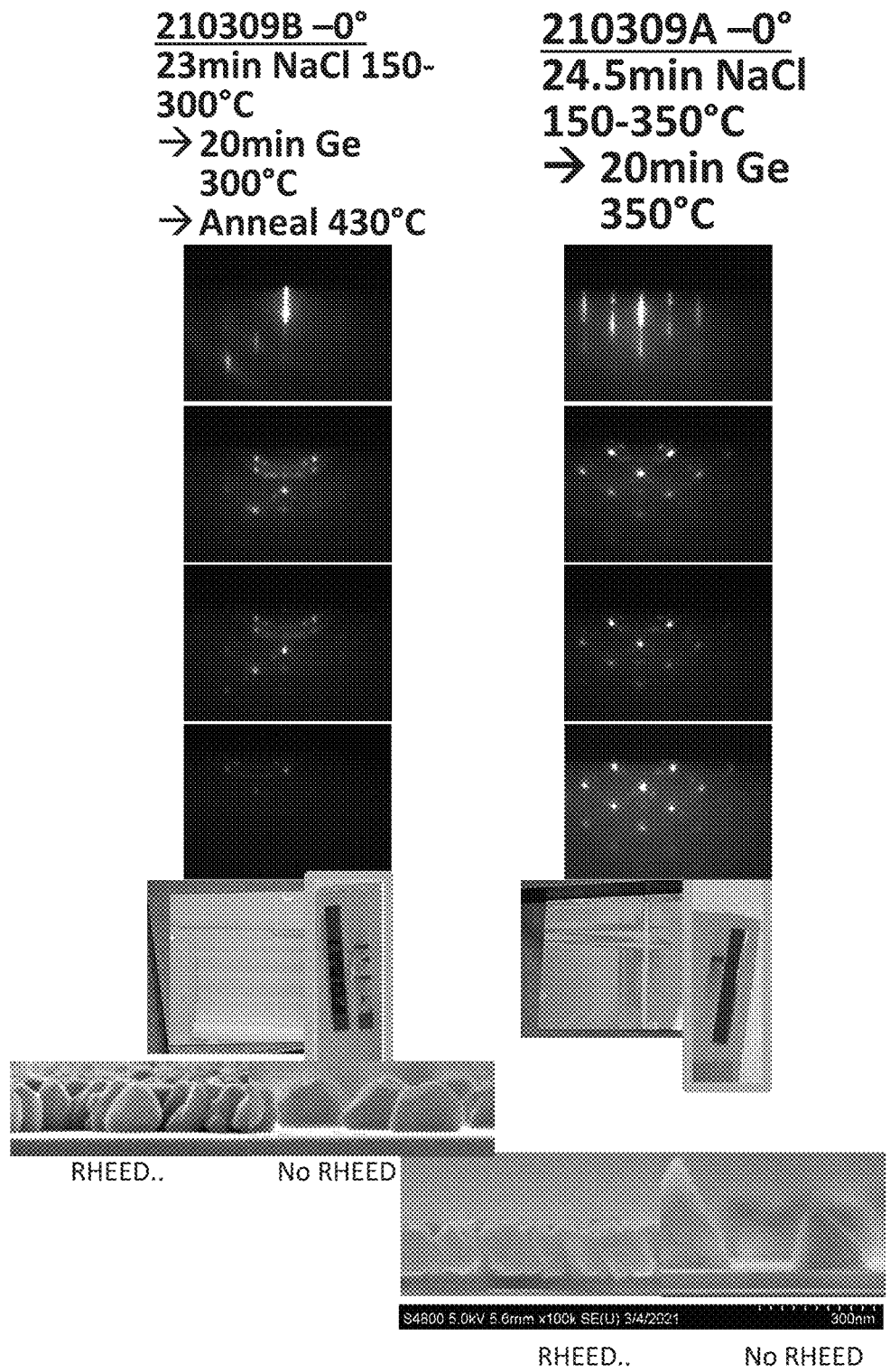
Figure 14C:
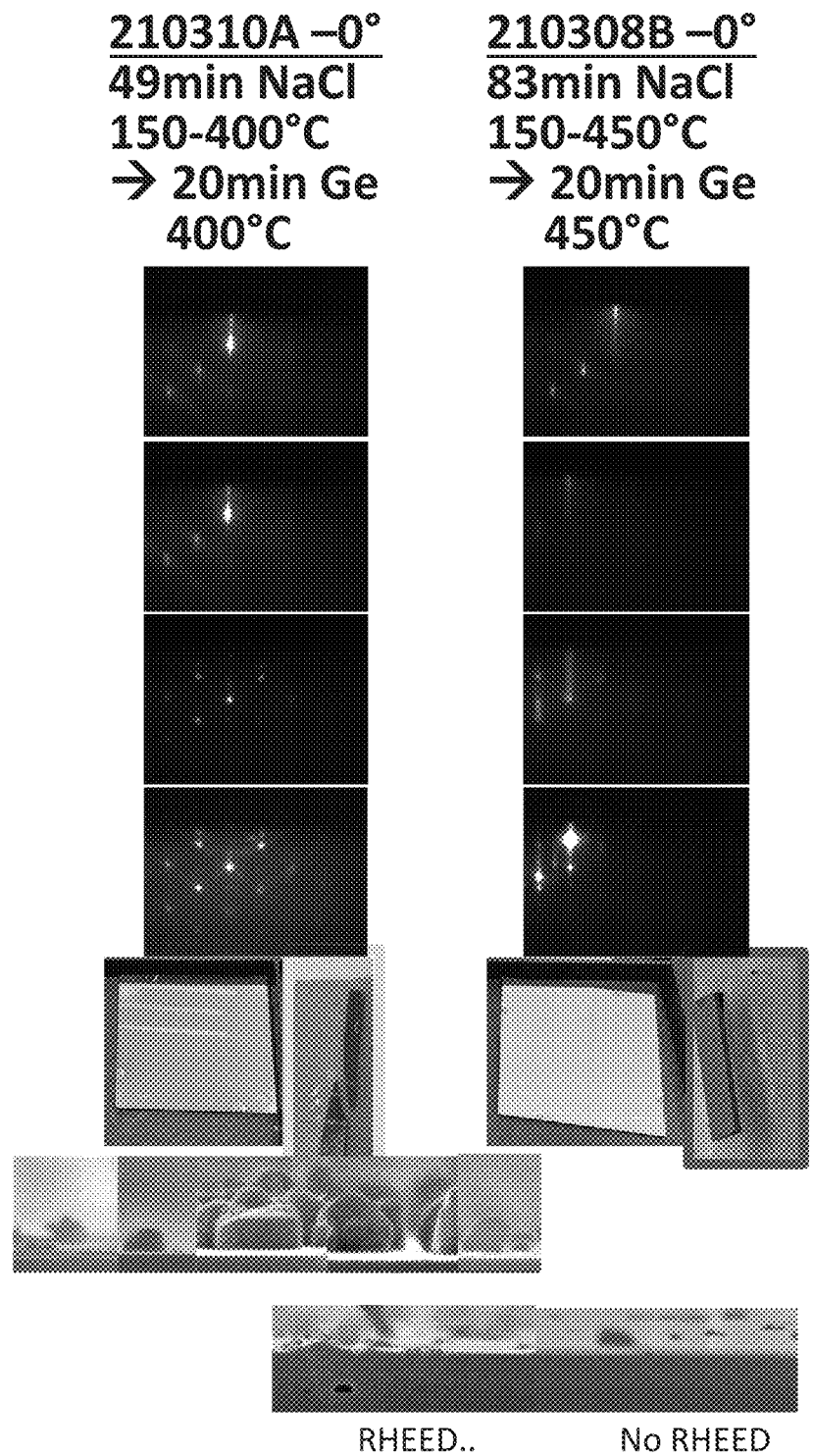

For the three areas that were exposed to RHEED during the GaAs deposition (see Panels (e-g) of FIG. 13), the dark background is similar in all cases. It consists of smaller islands, presumably GaAs, which do not degrade under the presence of the RHEED beam. The roughness is also observable at lower magnification, prior to any high focus conditions. When exposed during the initial minute, the presence of the lighter islands was completely suppressed, and exposure during the second minute shows slight reduction in the density of the light islands. However, any exposure during or after the two minutes of GaAs deposition shows a density of light islands, similar to regions that were never exposed at all or had fresh NaCl after exposure. The effects of the RHEED beam were not limited to the growth of binary material but were also seen in the deposition of Ge on NaCl films (see FIGS. 14A-14C).

Figure 15:
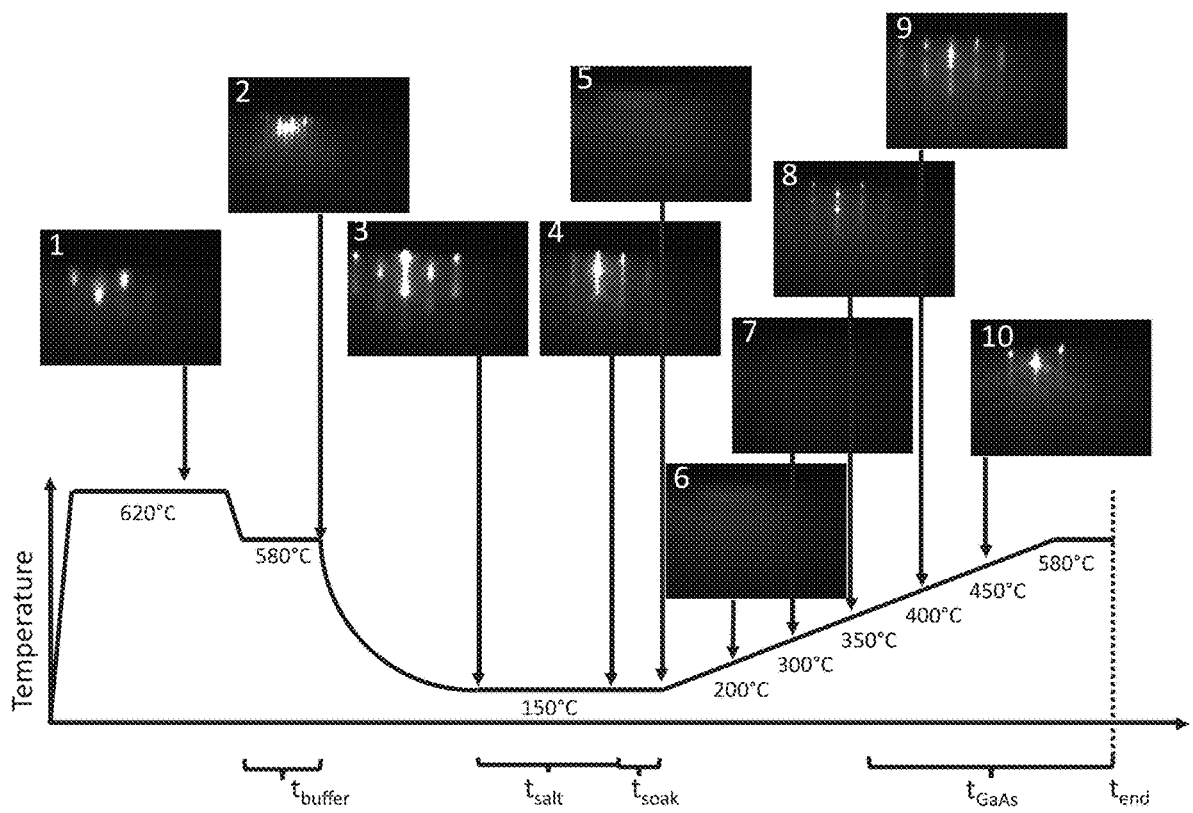
FIG. 15 illustrates a growth schematic and RHEED images of RHEED enhanced As adsorption details, according to some embodiments of the present disclosure.
Figure 16:
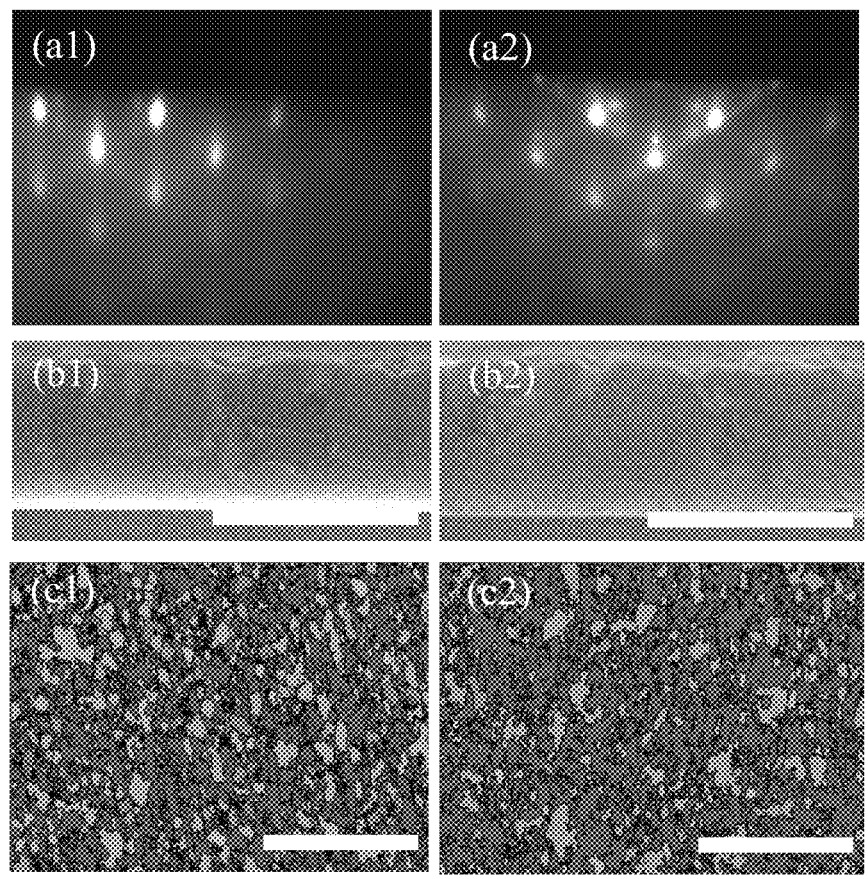
FIG. 16 illustrates GaAs second layers after growth deposited continuously while increasing temperature from 350° C. to 580° C. (a) RHEED images, (b) SEM (scale bar 600 nm), and (c) electron backscatter diffraction (EBSD) orientation maps of areas (scale bar 5 µm) (1, left column) exposed to RHEED and (2, right column) not exposed to RHEED until growth was completed, according to some embodiments of the present disclosure. (See FIG. 23 for gray-scale legend to interpret Panels (c1) and (c2)). All according to some embodiments of the present disclosure.
Figure 17:
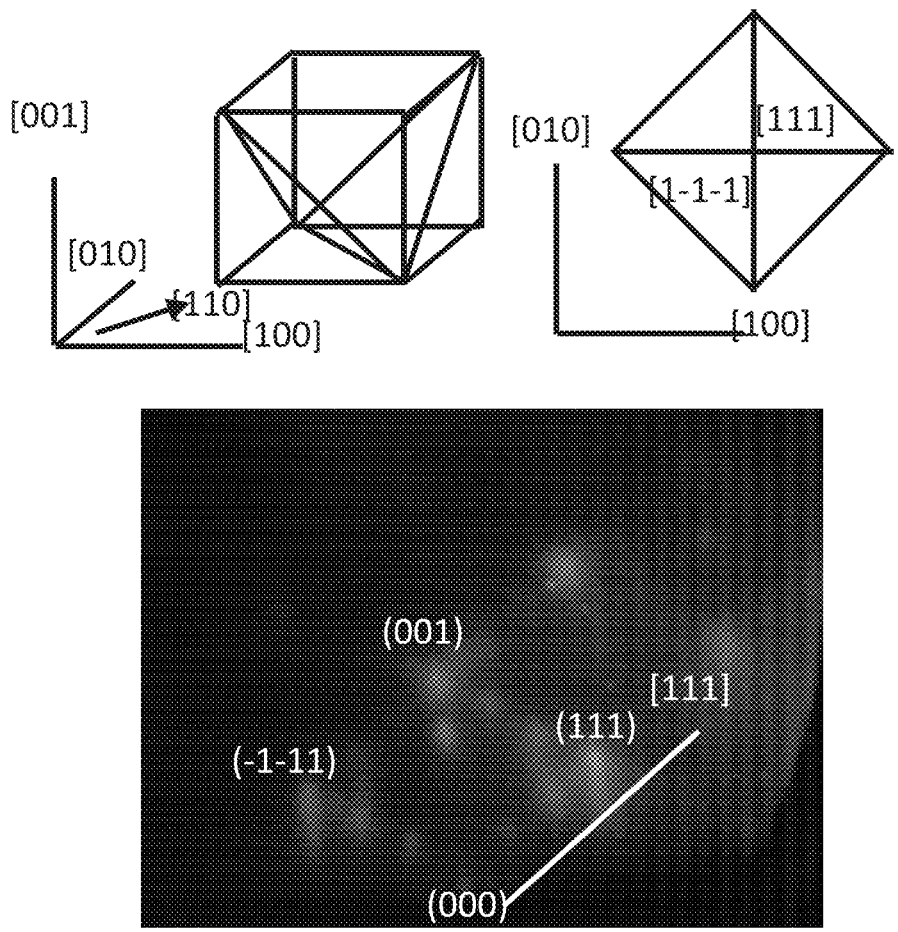
FIG. 17 illustrates symmetry discussion with respect to observed twins and the geometry of steps and such on the substrates tested herein, according to some embodiments of the present disclosure.

RHEED induced As adsorption at low temperature: The preferential condensation of amorphous As onto a bare NaCl surface at low temperature (~150° C.) was only observed in the presence of the electron beam (see FIG. 15). FIG. 16 illustrates the RHEED patterns, SEM, and EBSD maps of a GaAs sample on a NaCl layer having a thickness of about 30 nm that was deposited (the NaCl layer) at about 150° C., with only part of the sample exposed to RHEED under high As-pressure at 150° C. The sample was then heated to 350° C. and GaAs growth was initialized while heating to 580° C. The first column of images shows the area exposed to the RHEED beam post-NaCl, and prior to GaAs. The RHEED patterns at the end of growth reveal faint steeper chevrons in this REA indicating shallower faceting, while areas without exposure show the shallow chevrons discussed earlier (close to the {111} planes) with brighter shadow spots, suggesting a higher degree of twinning (see FIG. 17). The cross-section SEM images reveal similar thickness of both GaAs and the underlying NaCl. EBSD however, reveals a slightly different crystalline texture. Under the REA, where arsenic condensed on the surface at low temperature, there are four different crystalline orientations observed (consisting of different rotations of {100}, {223}, {221}, and {211}) (see FIG. 16). Quantitative pole figures, show that aside from the (100), which matches the substrate, one of these rotations of the 4-fold symmetric {221} grains are favored more than the other three equivalent rotations. In the area that was not exposed to RHEED (see Panels (a2)-(c2) of FIG. 16), the EBSD shows more area is now oriented similar to the substrate, and less of the {221} grains are observed. The {221} grain is a 30° rotation of the crystal on a [111] plane, similar to a E3 boundary, and would also explain the shadow spots observed in the RHEED patterns at the end of growth.

Figure 18:
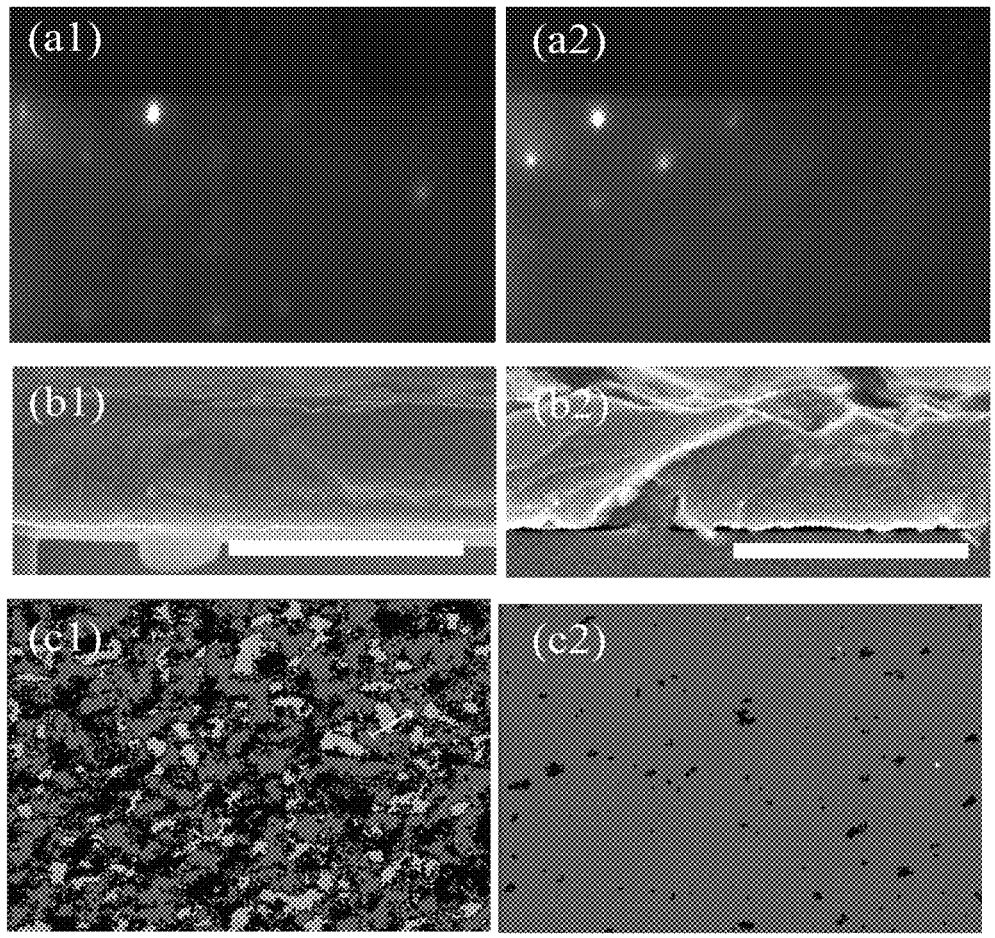
FIG. 18 illustrates GaAs second layers with an initial 3 minute growth period at 400° C. before a separate deposition of about 9 minutes at 580° C. and (a) RHEED images, (b) SEM (scale bar 600 nm), and (c) EBSD maps of areas (scale bar 5 µm) (1, left column) exposed to RHEED and (2, right column) not exposed to RHEED until growth was completed, according to some embodiments of the present disclosure. (See FIG. 23 for gray-scale legend to interpret Panels (c1) and (c2)).
Figure 19:
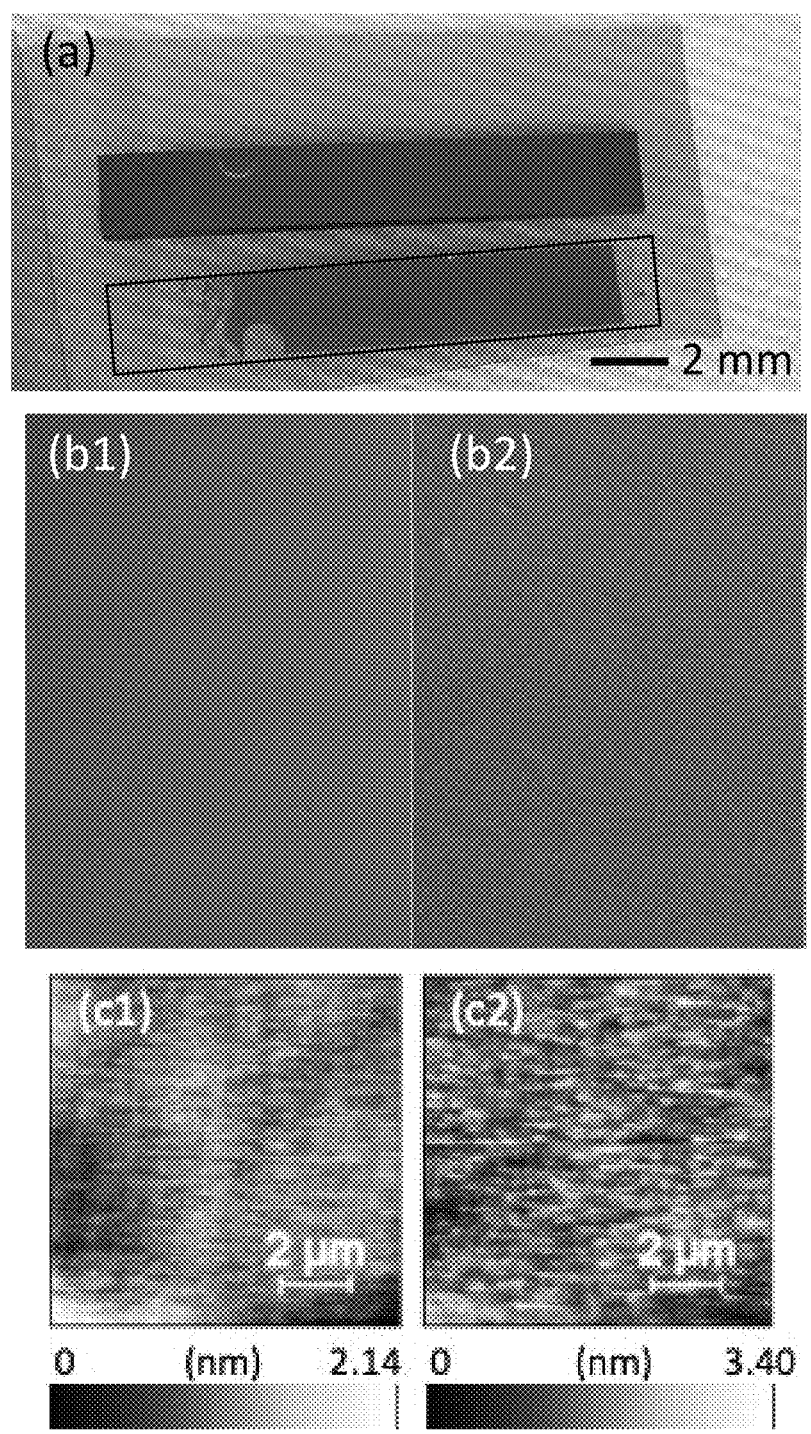
FIG. 19 illustrates: (a) an image of a substrate (top) with separated GaAs overlayer (bottom) on Kapton tape, the outline of where the entire piece was originally attached is outlined by the dotted line; 100× Nomarski images of (b1) a substrate after buffer layer growth and (b2) after film liftoff; atomic force microscopy images of (c1) a substrate after buffer layer growth and (c2) after film liftoff, according to some embodiments of the present disclosure.
Figure 20:
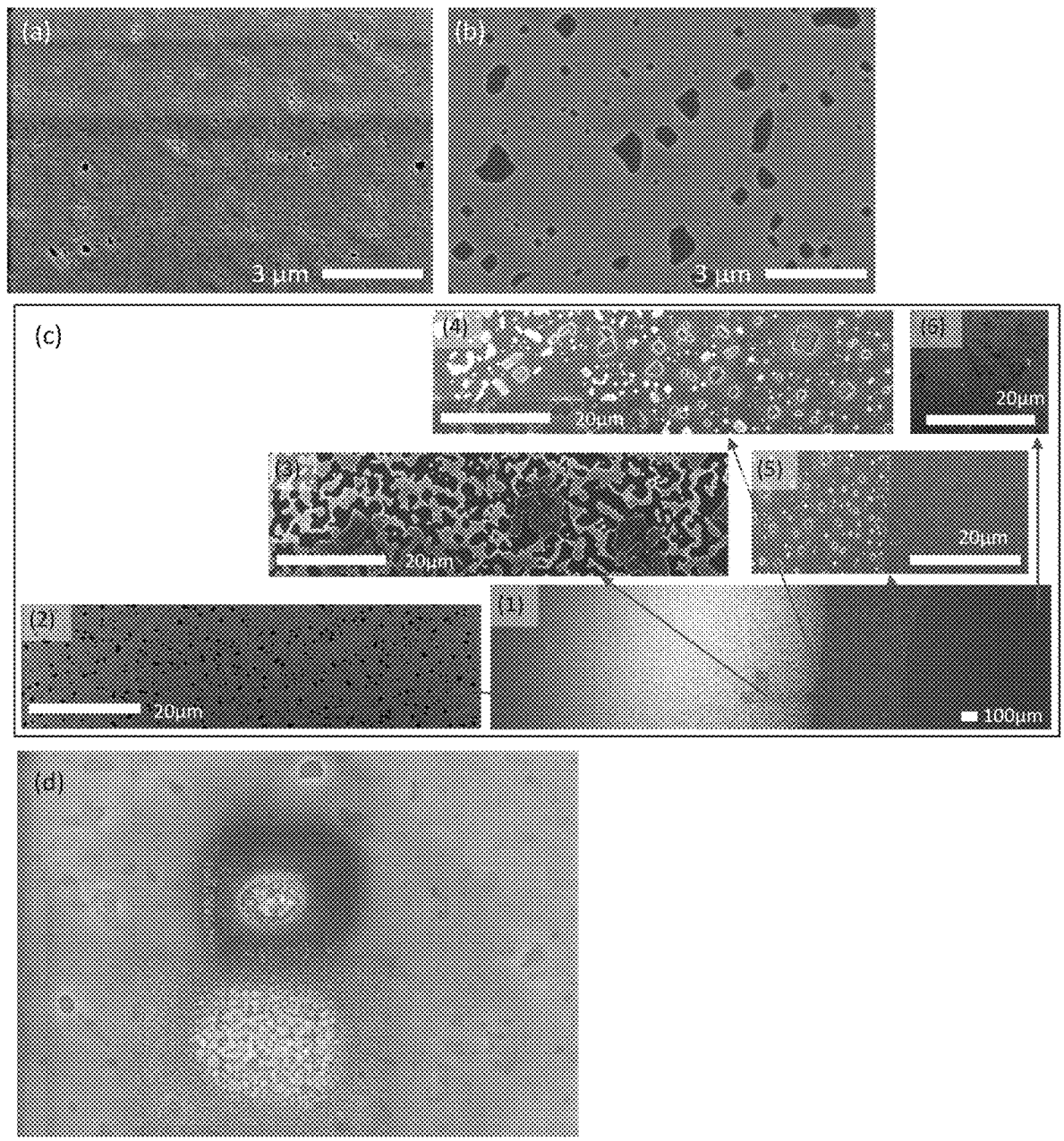
FIG. 20 illustrates plan view SEM images of a bare NaCl thin film deposited on GaAs, according to some embodiments of the present disclosure. (a) Image of the sample the day of growth and (b) 4 days after growth with most of the time in a nitrogen dry box. (c) Images of a cleaved section of the sample the day of growth that was partially dipped in water for ~1 s. (1) The low magnification image shows three distinct regions with the right side being the side dipped into water. Higher magnification images of the different regions (2-6) show lighter colored NaCl and the darker GaAs substrate. (d) Images of a NaCl surface with a 3 kV beam at low magnification showing regions that were roughened form exposure at higher magnification.

At first, one could assume that RHEED was detrimental for the growth of near single crystal GaAs on NaCl. However, as temperature was increased to get better quality films, the influence of RHEED becomes more complicated. FIG. 18 illustrates that it is important to preserve the NaCl layer at higher growth temperatures. The growth process is also illustrated in FIGS. 6A-6C. This sample was similarly half-exposed to RHEED after the NaCl deposition but was heated to ~400° C. where ~90 nm of GaAs was deposited (similar to FIG. 7). Then growth was paused and heated to 580° C. and a nominal thickness of about 300 nm of GaAs was deposited. The REA (see Panels (a1)-(c1) of FIG. 18) shows a pattern that has substantially less spots than samples nucleated at lower temperature, and an alkali halide layer of similar thickness remains, in stark contrast to samples grown at similar temperatures discussed above. There are only two predominant grain orientations in the REA, those oriented commensurate to the substrate (100), and a single orientation of the 4-fold symmetric {221} grain. This growth scheme, likely the higher temperature nucleation, seems to have suppressed the formation of {223} orientations. The RHEED pattern in areas not exposed to the electron beam (see Panel (a2) of FIG. 18) looks a bit brighter, perhaps a bit of azimuthal broadening visible in the first order spots. Cross-section SEM reveals a rough GaAs layer on top of a porous interface without the presence of any NaCl. Unsurprisingly, without any low temperature As-adsorb, this is very similar to the samples discussed above, and EBSD shows single crystalline material. Some preliminary data on the dissolution of these NaCl films are illustrated in FIG. 19 and FIG. 20.

Summary of possible effects of RHEED. The RHEED effects of only three samples of GaAs on NaCl are discussed above, but a large number of samples have been systematically grown and analyzed including some on the deposition of Ge directly on NaCl surfaces (see FIGS. 14A-14C). They reveal that the effects of RHEED are quite complex, and not necessarily only beneficial or detrimental. Some general observations and conclusions are summarized below.

(1) Excessively long RHEED exposure times do not help. While some beneficial effects may be gleaned from selective exposure, prolonged exposure does not appear to provide desirable results. This could be due to surface roughening or related to the enhanced twinning observed in the REAs, but constant exposure during the GaAs deposition resulted in a more polycrystalline material and sometimes spontaneous delamination of the film during growth.

(2) The presence of RHEED roughens NaCl. This effect is likely reduced with reducing the accelerating voltage, but then the pattern becomes too dim to be useful. This effect also seems to be larger at higher temperatures, i.e., at 15 kV it takes ~90 seconds for the RHEED pattern to transition from streaky to spotty at 300° C., but at 150° C. even after exposure for significantly longer times the RHEED is unchanged.

(3) The presence of RHEED enhances As-adsorption. As discussed earlier, arsenic preferentially condensed where the RHEED treating of the surface was performed. It is possible this is from a slightly rougher surface, or from some sort of charging effect. As the temperature is increased, this amorphous As layer has to desorb before the NaCl surface atoms can, so in some way protect the NaCl at elevated temperatures. However, they both begin to desorb at similar temperatures, so the impact is limited. Similarly, to (1), if exposed for too long and too much As is adsorbed prior to heating, and not sufficiently desorbed prior to subsequent deposition, the GaAs second layer tends to delaminate from the substrate.

(4) The presence of RHEED promotes nucleation of GaAs on NaCl. This seems to be true not just during the actual nucleation step, but even exposure prior to opening the Ga shutter with the As adsorption. This is one of the key benefits of the use of RHEED for the formation of higher quality GaAs films on NaCl as swift formation of a complete GaAs layer is crucial to enable higher temperature depositions without sublimation of the NaCl layer.

(5) RHEED affects the crystallinity of GaAs grown on NaCl using traditional co-deposition techniques. In the cases discussed above it is possible that RHEED (or at least the As adsorption) is a cause of the 30° rotations about the [111], as REAs have more of the {221} grains than areas that are not exposed. However, in lower temperature grown GaAs (not shown) REAs showed significantly larger grained material (microns) compared to tens of nanometer sized grains, but there was no crystallographic relationship to the underlying substrate or NaCl layer.

The following language provides either adds additional data and language to that described above for the and/or completely new results and language.

Growth of NaCl on different GaAs surface reconstructions (arrangement and/or dimerization of surface atoms): The deposition of NaCl on GaAs substrates with three different primary surface reconstructions was investigated. A c(4×4) (see Panel (a1) of FIG. 21) was easily achieved through cooling the sample to about 350° C. while maintaining a high arsenic background pressure. A (2×4) pattern (see Panel (b1) of FIG. 21) was achieved by closing the As-valve immediately after the GaAs buffer deposition onto the GaAs substrate was completed at about 580° C.; residual arsenic in the chamber maintained a Ga-rich surface from forming. Because of this residual arsenic background, the Ga-rich (4×2) surface reconstruction was more difficult to achieve (see Panel (c1) of FIG. 21). The As-valve was again immediately closed following deposition of the GaAs buffer layer onto the GaAs substrate at about 580° C.; the temperature was held constant while the chamber was allowed to pump out for several minutes. Then a Ga flux of ~2 ML was supplied and the RHEED pattern (observed along <110>) transitioned from 2× to 4×, signifying a Ga-rich surface. As the sample cooled, arsenic more readily condensed on the surface and the pattern began to slowly revert back to 2×. This was mitigated through subsequent Ga-flashes until the temperature of the substrate reached about 530° C. Any supply of Ga at temperatures below this resulted in a more diffuse diffraction pattern (not shown), likely because the surface mobility of the Ga adatoms was too low to facilitate reconstructions.

Figure 21:
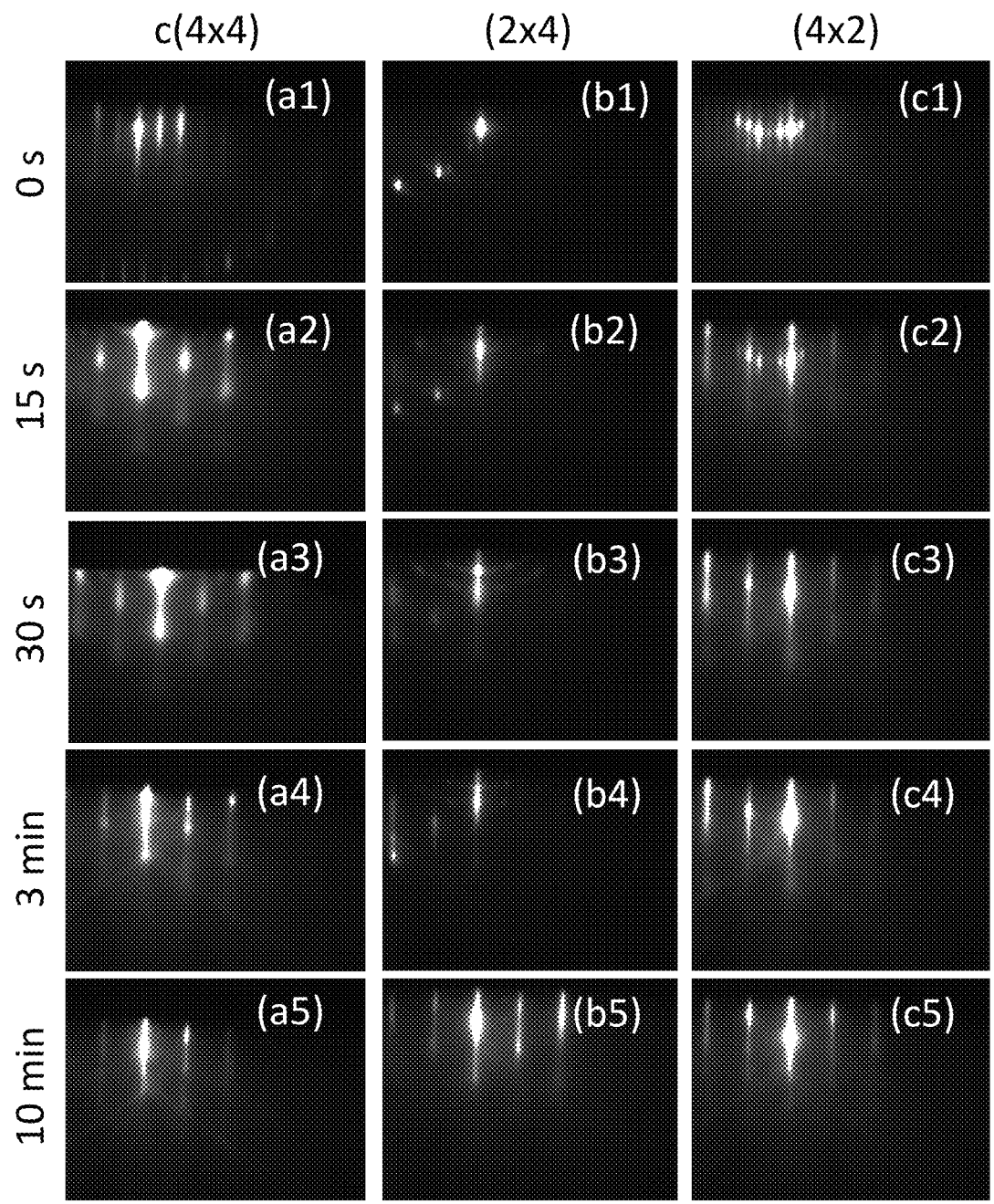
FIG. 21 illustrates RHEED patterns taken (1, top row) prior to, and after (2) about 15 seconds, (3) ~30 seconds, (4) ~3 minutes, and (5, bottom row) ~10 minutes of NaCl deposition onto GaAs (100) substrates taken parallel to the [110] direction on (a, left column) a c(4×4), (b, middle column) along the [1$\bar{1}$0] a (2×4), and (c, right column) [110] direction on a (4×2), according to some embodiments of the present disclosure.

The evolution of the RHEED patterns during a ten-minute NaCl deposition at 150° C. on each of the reconstructed GaAs surfaces are shown in Panels (a)-(c) of FIG. 21. There is a notable difference in the patterns of the resulting NaCl during the early moments of growth. After about 15 seconds (~2.5 ML) of NaCl deposition on the As-rich c(4×4) GaAs substrate surface, the reconstructions disappeared and the streaks broadened and become spottier signifying a more disordered and three-dimensional growth (see Panel (a2) of FIG. 21). Additionally, the presence of faint rings represents some degree of polycrystallinity at this early stage. After about 30 seconds (corresponding to a NaCl layer having a thickness of about 1.5 nm) of deposition, the pattern looks similar (see Panel (a3) of FIG. 21). However, with prolonged deposition (e.g., a NaCl layer having a thickness of about 9 nm, see Panel (a4) of FIG. 21) the rings have disappeared, and the streaks have become tighter and less spotted, and Kikuchi lines begin to be observed, all indicating a smoother more crystalline material. This trend continues and eventually becomes very streaky (see Panel (a5) of FIG. 21).

The initial moments of growth of NaCl on As-rich 2×4 GaAs surfaces again show weak ring like characteristics (see Panel (b2) of FIG. 21), but in this case they become more pronounced and spotted during the first few nm of deposition (see Panels (b-c) of FIG. 21). At about a 9 nm thickness of the NaCl layer (see Panel (b4) of FIG. 21) the rings have started to fade, but unlike the previous case are not yet gone completely, and the pattern becomes streakier. However, after additional depositing, at about a 30 nm thickness of the NaCl layer, (see Panel (b5) of FIG. 21) there are no ring-like characteristics, and the pattern is streaky.

In contrast to the As-rich cases, the initial growth on a Ga-rich 4×2 GaAs surface (see Panel (c2) of FIG. 21) does not show any ring like characteristics. The original reconstructions seem to fade more slowly, and the pattern is only marginally more spotted. However, after only a few more nanometers of NaCl growth, any trace of the original reconstructions has disappeared (see Panel (c3) of FIG. 21) and the pattern is already similar to the end-case scenario for growths on As-rich GaAs surfaces. No substantial changes are observed with further growth (see Panels (c4) and (c5) of FIG. 21) aside from becoming brighter, and Kikuchi lines becoming more prominent. It must also be noted that throughout all these depositions, the pattern remains 4-fold symmetric. Each NaCl layer was subsequently capped with GaAs to protect them for ex-situ measurements.

Figure 22:
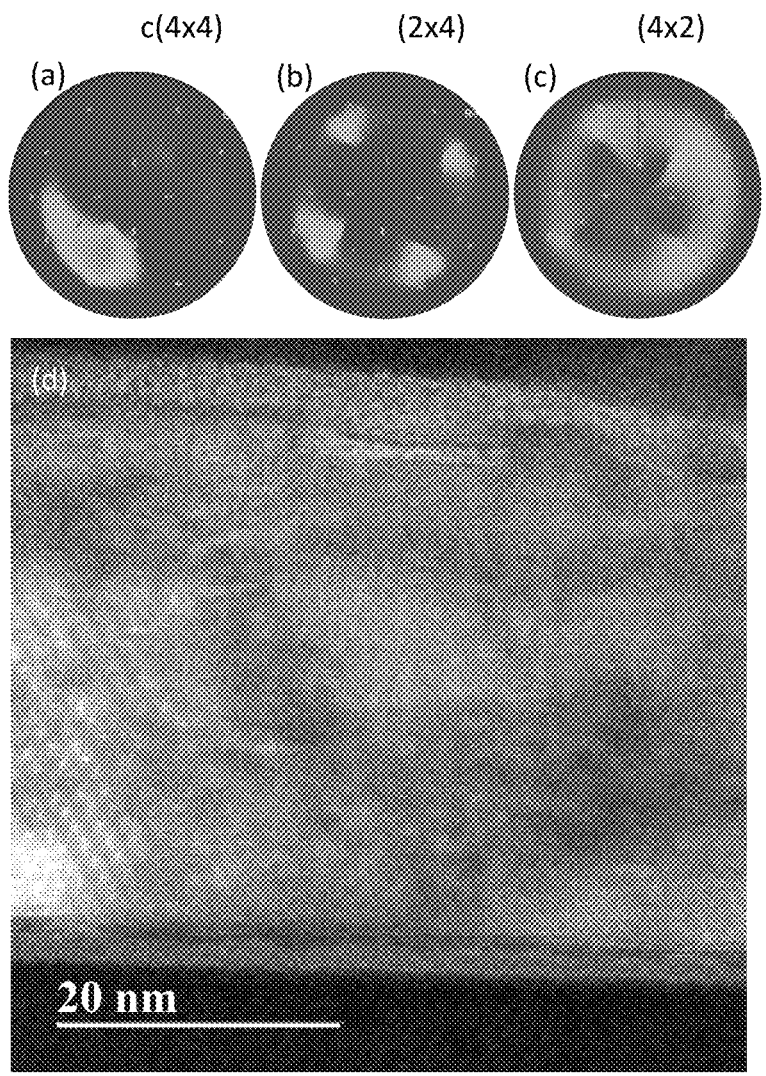
FIG. 22 illustrates XRD pole figures of the (222) reflection of NaCl deposited on (a) a c(4×4), (b) a (2×4), and (c) a (4×2) GaAs substrate reconstructions, according to some embodiments of the present disclosure. (d) TEM image of a NaCl grown on a c(4×4) GaAs surface with insets showing FFTs of the NaCl (top) and GaAs (bottom).

Both GaAs and NaCl have very similar lattice constants at room temperature. Thus, to avoid any spurious signal from the GaAs cap, XRD pole figures were taken of the NaCl (222) peak as the corresponding GaAs reflection should be forbidden. The results show highly textured patterns with 4-fold symmetry in each case (see Panels (a)-(c) of FIG. 22). The additional peaks correspond to four 90° rotations of grains that are most closely {221} and {223} planes. The peaks corresponding to epitaxial NaCl are more intense relative to the other peaks in the sample using the Ga-rich reconstruction (see Panel (a) of FIG. 22). This contrasts with the final RHEED patterns observed for each case, where the NaCl displays 4-fold rotational symmetry and spacing between peaks nearly identical to the GaAs (100) substrate. It is possible that the other orientations are buried near the substrate/NaCl interface and are visible in the RHEED pattern as the spotted/partial ring structure in the early stages. TEM measurements (see Panel (d) of FIG. 22) show a <2 nm layer of material at the interface with the substrate which appears to be amorphous. However, in any NaCl above this layer, no other distinct orientations are observed; fast Fourier transforms (FFTs) of both the NaCl film and GaAs substrate reveal only a single matching pattern suggesting high crystallographic alignment. The c(4×4) reconstruction was used as the platform for the for the additional studies described below.

Growth of (001) oriented GaAs films on NaCl: Three samples of GaAs layers deposited on NaCl layers were chosen for comparison with growth parameters outlined in below Table 1. All samples had a NaCl deposition rate of about 3 nm/min, a GaAs deposition rate of about 33 nm/min when co-supplying Ga and As and were heated between growth regions at a rate of 20° C./min. Additionally, immediately after the NaCl deposition at 150° C. onto the GaAs substrates, the samples were exposed to As and a portion of the sample was exposed to the RHEED beam. As shown herein (e.g., see FIG. 13), exposure to the RHEED beam promotes faster nucleation of the GaAs to form the GaAs layer on the NaCl layer, which is crucial for protecting the volatile NaCl from subliming during the higher temperature GaAs deposition, which is discussed below.

TABLE 1

Growth parameters for GaAs films grown on NaCl thin films

| | Salt Dep | | GaAs Nucleation | | | GaAs Growth | | |
|---|---|---|---|---|---|---|---|---|
| | Time (min) | Temp (° C.) | Time (min) | As/Ga | Temp (° C.) | Time (min) | As/Ga | Temp (° C.) |
| Sample A | 15 | 150 | 3 | 1:1 | 375 | 9 | >1 | 580 |
| Sample B | 25 | 150 | 3 | 1:1 | 375 | | | |
| Sample C | 25 | 150 | 17 | MEE | 350 | 1 | 1:1 | 400 |

Referring to Table 1, for sample A, GaAs was first deposited on a NaCl layer at a lower temperature (~100 nm of GaAs at 375° C.) with an As:Ga=1 (calibrated at 580° C.) followed by a typical As-rich GaAs deposition (300 nm at 580° C.). The central portion of the sample exposed to the RHEED beam is visibly different (see Panel (a) of FIG. 23). Cross-sectional STEM images illustrated in Panels (b) and (c) of FIG. 23 were taken from the regions without and with RHEED exposure, highlighted by the green and red circles, respectively. Diffraction patterns were taken at different locations throughout the thickness of each region of the GaAs overlayer: (1) at the top, (2) near the middle, and (3) near the GaAs/NaCl interface and can be compared to the diffraction pattern of the substrate (inset of Panel (a) of FIG. 23).

Figure 23:
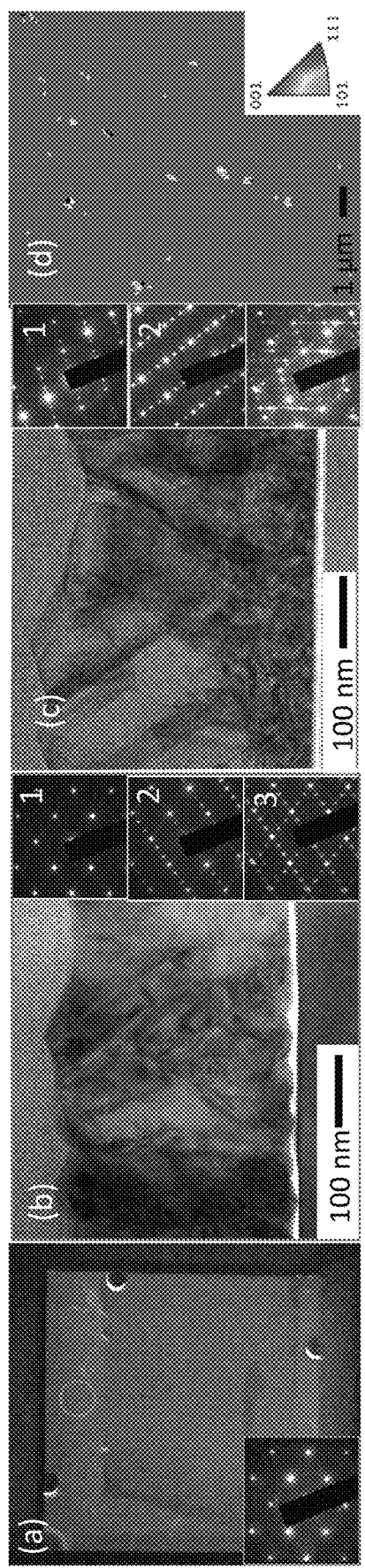
FIG. 23 illustrates: (a) an image of a sample showing the central area exposed to the RHEED beam prior to GaAs deposition; (inset) STEM diffraction pattern of the substrate. STEM images of areas (b) not exposed to RHEED (from green circle) and (c) exposed to RHEED prior to GaAs deposition (from red circle) and the corresponding diffraction patterns from (1) the top of the film, (2) the center of the film, and (3) near the NaCl interface. (d) illustrates EBSD orientation map from the RHEED exposed area. All according to some embodiments of the present disclosure.

Without any exposure to RHEED (see Panel (b) of FIG. 23) the NaCl layer is rough and incohesive, with the overlayer coming in close proximity (or attached) to the substrate. This is likely because of incomplete coverage of the initial low-temperature GaAs, allowing the NaCl to desorb from the surface prior to becoming more completely capped by the GaAs layer at high temperature, as shown below. The NaCl grains appear slightly tapered, with smaller grains near the interface and larger grains near the top. The diffraction patterns near the NaCl interface show highly textured grains with the (111), (111), (220), and (002) plane parallel to the same respective plane in the substrate. Moving toward the top surface, the texturing trends toward a (002) oriented layer until a single set of spots nearly identical to the substrate pattern is observed.

In the region exposed to the RHEED (see Panel (c) of FIG. 23), the NaCl layer remains flat and cohesive, with no indication that the GaAs overlayer is attached to the substrate. The GaAs layer at the upper interface of the NaCl layer has smaller grains than in the areas without RHEED exposure, but again taper outward with a larger grain structure at the surface. The thicknesses of the small and large grain regions roughly correlate to the low and high temperature depositions, respectively. The diffraction patterns reveal that the GaAs grains in this area are highly textured with orientations similar to the area without RHEED exposure, but the high degree of streaking suggests a high stacking fault density. Above the small-grained GaAs region, the patterns are increasingly textured, and the stacking fault density is reduced. The intensity of intermediate spots decreases as one approaches the top surface of the GaAs layer, suggesting an increase in the texture and grain size. EBSD images of this area (see Panel (d) of FIG. 23) shows that most of the GaAs area exposed to RHEED is (001) oriented, but with small {221} inclusions separated by CSL Σ3 boundaries. The small-grained GaAs areas, correlating to low-temperature deposition, has a higher degree of grain misorientation, which can provide seeds for the tapered columnar growth of the GaAs, leading to these inclusions.

Low temperature co-deposition: Referring to Table 1, Sample B was grown to directly investigate the crystallinity of the low-temperature growth of GaAs on NaCl films. Its processing included an identical RHEED exposure of the NaCl layer, after its deposition, followed by a low temperature deposition step of a GaAs layer onto the NaCl layer (100 nm of GaAs at 375° C.), but omits the high temperature step. Cross sectional SEM was performed in regions of the sample without and with RHEED exposure. Without RHEED exposure (see Panel (a) of FIG. 24), the low temperature GaAs layer deposited on the NaCl layers is chunky, rough, and incohesive. Even at a relatively lower temperature between about 350° C. and about 400° C., desorption of the NaCl was rapid. It is worth repeating that the effusion cell temperature for the NaCl was only about 480° C. As a result, the NaCl layer is much thinner (<10 nm) in this region compared to the expected NaCl thickness (~75 nm) based on purely low-temperature (~150° C.) calibrations. This highlights the importance of quickly and completely capping the NaCl layer with the GaAs layer, which is exacerbated at higher temperatures.

Figure 24:
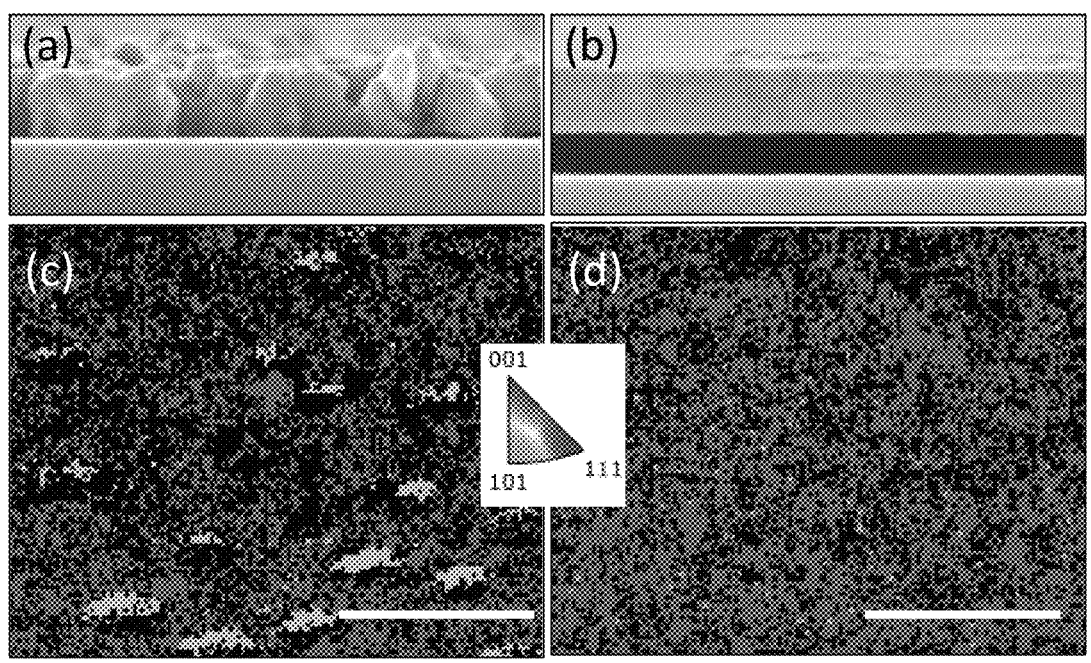
FIG. 24 illustrates SEM images of GaAs second layers co-deposited on NaCl layers (a) without and (b) with RHEED exposure (scale bars 100 nm). EBSD orientation map showing primarily (100) oriented films for (c) without and (d) with RHEED exposure (scale bars 5 μm). All according to some embodiments of the present disclosure.

The SEM of the RHEED exposed area (see Panel (b) of FIG. 24) is distinctly different. The NaCl layer (dark region) is significantly thicker (~55 nm) but still thinner than expected, as some will still have sublimated during heating to the nucleation temperature, and prior to complete coalescence. RHEED exposure increases the nucleation density of GaAs islands, leading to faster coalescence of a full film, protecting the NaCl from further continuous desorption during the GaAs deposition. The interfaces and surfaces of the material in this region are also much smoother.

EBSD orientation maps were also taken to look at the crystallinity of the GaAs overlayer in both regions (see Panels (c) and (d) of FIG. 24). The black areas are unindexable in the EBSD analysis due to weak Kikuchi patterns. This is attributed to poor crystallinity from the presence of surface defects or a high degree of roughness. Using the traditional co-deposition method results in the presence of large {221} grains (some >1.5 μm) in the area without RHEED exposure. The degree of unindexable area also correlates with the large roughness observed in this region. The smoother film in the RHEED exposed area results in a lower degree of unindexable area. This area is mostly (001) oriented. However, there are still areas registering as {221}, albeit significantly smaller in size. The misoriented GaAs grains in both regions are the same: 60° rotations of the crystal about a <111> direction, the same as the inclusions observed in Panel (d) of FIG. 23. This provides good evidence for why they are also observed in the thicker films.

Migration Enhanced Epitaxy nucleation layer: To achieve better crystallinity in the low temperature seed layer, referring again to Table 1, Sample C was grown using a migration enhanced epitaxy (MEE) technique to promote adatom mobility. Repeatedly and separately supplying pulses of Ga (2 ML) followed by arsenic with 0.5 second wait times between each was repeated until a GaAs layer having an overall thickness of ~66 nm was deposited. Because the effective growth rate of MEE (<4 nm/min) is significantly slower than co-deposition (i.e., supplying Ga and As simultaneously) (~33 nm/min), due to the decreased supply of Ga in the shutter sequencing, as well as time lost to shutter transients, the temperature was reduced slightly to 350° C. (compared to 375° C. for co-deposited GaAs). Otherwise, significant NaCl loss occurred prior to realizing complete coverage of a GaAs film. A GaAs layer having a thickness of ~33 nm was co-deposited on the MEE GaAs layer at a temperature of about 400° C. to look for evidence of NaCl desorption at higher temperatures concurrent with GaAs growth.

Figure 25:
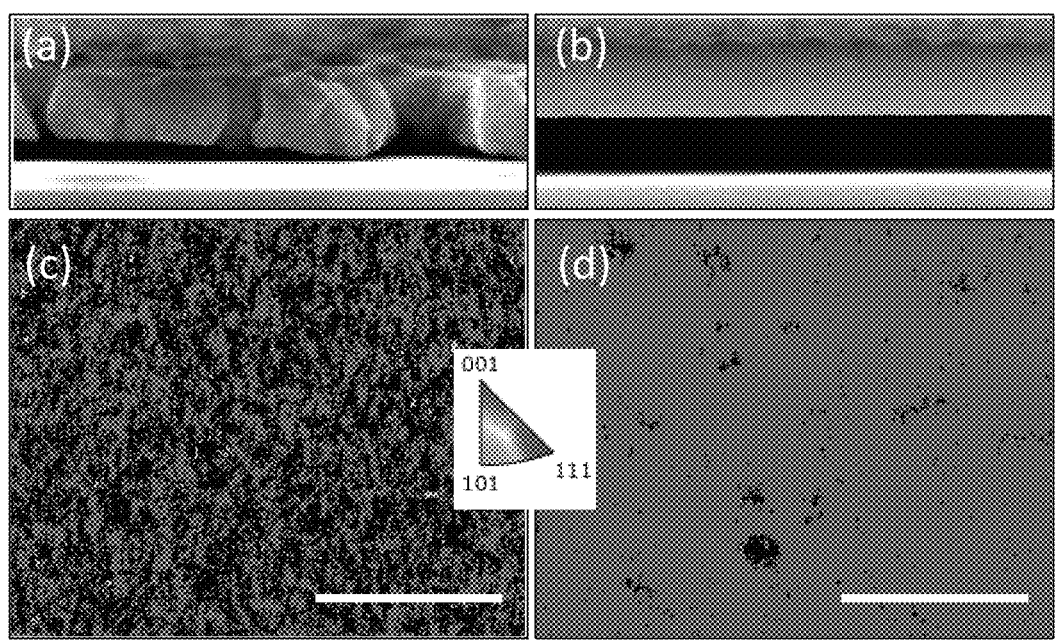
FIG. 25 illustrates SEM images of GaAs on NaCl layers using MEE (a) without and (b) with RHEED exposure (scale bars 100 nm). EBSD orientation maps showing primarily (100) oriented films for (c) without and (d) with RHEED exposure (scale bars 5 μm). All according to some embodiments of the present disclosure.

A cross section SEM of the regions without RHEED exposure is shown in Panel (a) of FIG. 25. Here, the GaAs layer is chunky, not fully conformal and the NaCl thickness ranges from nearly none to ~30 nm (the dark layer under the light grey GaAs chunks, the white area is the GaAs surface). Comparing the same region of the co-deposited sample in the previous section (see Panel (a) of FIG. 24, the roughness is lower, and the size of the cohesive islands seems to be slightly larger. This suggests that MEE, while still very much having a 3D growth mode, does slightly enhance lateral growth allowing for larger island formation. This results in better protection of the NaCl layer in these covered areas, and a comparatively thicker NaCl layer than the previous case. However, with the deposition time being significantly longer, in areas devoid of a GaAs island, the exposed NaCl continuously desorbs until none is left. This is especially true if no island forms prior to heating to 400° C.

In the area with RHEED exposure (see Panel (b) of FIG. 25), the cross-section SEM appears largely similar to the same region discussed in the previous section for the co-deposited sample. However, the NaCl layer (black) is ~20 nm thicker, which is approximately equal to the target thickness. While this is likely in part due to the lower temperature of the MEE step, the area without RHEED exposure shows that significant desorption can still occur if not completely capped. Thus, one may suspect that with the increased nucleation rate due to the exposure to RHEED in this area, coupled with enhanced lateral island growth from MEE, the NaCl is overall capped more quickly in this region compared to traditional co-deposition.

The EBSD orientation maps of the area without RHEED exposure (see Panel (c) of FIG. 25) still shows some small misoriented inclusions, but not nearly as large as those using only traditional co-deposition. In the region with RHEED exposure there is significantly less unindexable signal (see Panel (d) of FIG. 25), and a solely (001) oriented film with no additional orientations observed. It is expected that by using this single orientation template the crystallinity may persist throughout continued deposition. Similar to that which was described above, the non-indexable areas should be reduced and a clean (001) film without misoriented inclusions should be observed. The work demonstrates the feasibility of a method for obtaining GaAs films with a crystalline surface orientation matching that of an underlying GaAs substrate, with a continuous NaCl layer positioned between the two GaAs layers.

Liftoff of GaAs films: The GaAs overlayer (i.e., second layer 130) was attached to Kapton tape and placed in room-temperature water to test separation from the GaAs substrate. Many samples were tested and the water rapidly dissolved the NaCl layer, with NaCl layers as thin as nominally ~3 nm facilitating near immediate liftoff. It is also worth noting, when using thicker NaCl layers submersion in water was not always necessary, and the second layer of GaAs could be simply peeled from the underlying GaAs substrate. We hypothesize that this mechanism more closely resembles cleaving of the softer NaCl material because both the lifted GaAs overlayer and the GaAs substrate have a slight iridescence, which immediately disappears from both after rinsing in water which dissolves any remaining NaCl adhering to either GaAs layer.

Panel (a) of FIG. 24) illustrates a piece cleaved from sample A (taken from the right side of Panel (a) of FIG. 23) after separation of the GaAs film from the original wafer. The substrate (above) was placed back on the tape, growth side up. The area that was originally attached to tape, prior to placement in water, is outlined below by the black line. The central region was exposed to the RHEED and maintained a continuous NaCl layer. Thus, it was easily separated and what is shown is the side of the overlayer that once interfaced with the NaCl. As discussed above, the edges of the sample were never exposed to RHEED and had a thinner and less cohesive NaCl, thus fusing to the substrate during the high temperature deposition step and inhibiting liftoff.

Additionally, the films from both Samples B and C lifted off completely and uniformly over the entire area tested (not shown). This is promising, as areas exposed to RHEED maintained a continuous NaCl layer under a complete GaAs second layer, especially the single crystalline material shown in Panels (d) of FIG. 25, which should protect the NaCl layer from any desorption when heating to 580° C. In these samples, the areas that were not exposed to RHEED also lifted off, despite not having a continuous NaCl layer. This suggests that while the NaCl could completely desorb from under discrete overlying GaAs islands, the GaAs islands would simply sit on the substrate, and not re-bond unless exposed to higher temperatures.

Nomarski images of a GaAs wafer after deposition of a buffer layer and the surface after liftoff of a GaAs film are compared in Panels (b) and (c) of FIG. 19. These, coupled with 10×10 µm atomic force microscopy (AFM) scans, show that the GaAs buffer layer deposited on the GasAs substrate is very smooth (rms roughness of 0.27 nm). After deposition and removal of NaCl layer and the second GaAs layer the rms roughness increased by only 0.2 nm, there are large areas without any obvious surface defects, and it looks similar to the buffer layer surface. This is with only a short immersion time (<10 s) in water and dried with $N_2$, and without any additional cleaning or surface preparation. More deliberate cleaning steps and buffer layer regrowth would be expected to further improve the surface which is ultimately promising for reuse of the substrate.

In conclusion, deposition of NaCl on GaAs was found to be dependent on the surface reconstruction of the GaAs surface. RHEED suggests that the formation of polycrystalline material at the interface can be avoided by growing on a Ga-terminated surface. Subsequent GaAs forms in a 3D growth mode, with further growth resulting in tapered columnar grains highlighting the importance for a highly crystalline seed layer. Low-temperature GaAs seed layers with highly single crystalline surfaces are obtained by combining careful exposure to the RHEED beam and utilizing methods to increase adatom mobility. GaAs overlayers are easily removed from the parent substrate through dissolution of the NaCl layer in water, leaving behind a surface similar to the original wafer. These results pave the way for a new substrate release layer.

Figure 26:
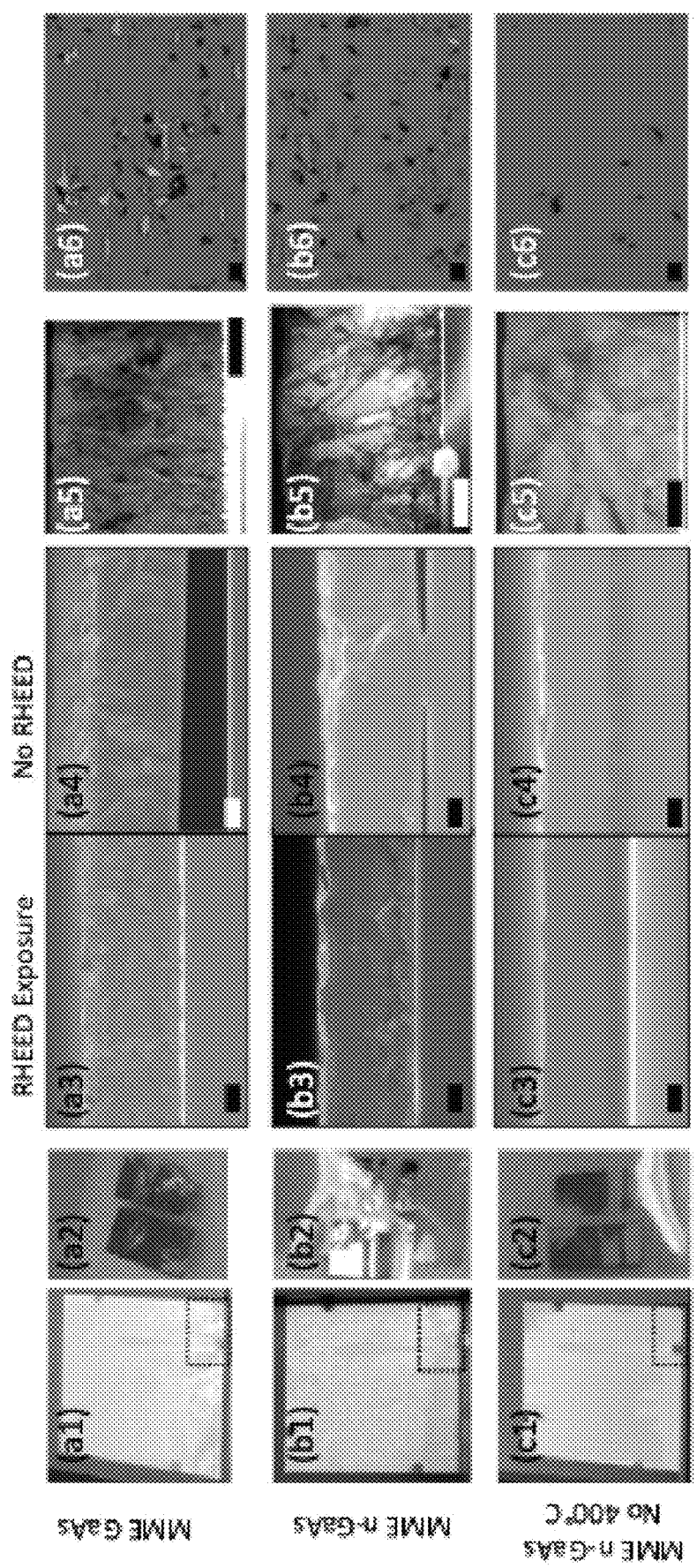
FIG. 26 illustrates all-MBE cells grown on the templates, as describe herein, according to some embodiments of the present disclosure. (a) MME of uid-GaAs, (b) MME of n-GaAs, and (c) MME of n-GaAs without a 400° C. step. (1) images of the 2×2 cm samples after removal from the chamber. (2) images of the cleaved section from (1) showing the device layers (right) attached to Kapton tape after removal from the substrate (left). Cross section SEM images from areas (3) with RHEED exposure and (4) without RHEED exposure. (5) TEM images from areas with RHEED exposure. (6) plan-view EBSD from areas with RHEED exposure. The scale bars for SEM, TEM, and EBSD images are all 1 μm.

A final all-MBE grown cell used a template without the 400° C. deposition step. Panel (c1) of FIG. 26 illustrates the image of the device after removal of the chamber, again revealing distinctly different regions where the RHEED was shadowed (at the bottom of the sample and clip region) compared to the remainder of the area where RHEED was moved across the sample. However, this sample also reveals distinct vertical lines, which are indicative of the manual moving of the RHEED beam across the surface. Again, only the areas exposed to RHEED were successfully removed from the substrate (see Panel (c2) of FIG. 26).

Cross section SEM images of this sample (see Panels (c3, C4) of FIG. 26) reveal very smooth cleaved edges. The RHEED area shows a full NaCl layer beneath the solar cell device layers. Because of this smooth cleave, the contrast differences between the n-type layer (darker) and the p-type layer (lighter) of the solar cell device are discernable. The surface in this area is also smoother than other examples described herein, with no large facets observed. However, there still is some observable roughness. In the area without RHEED exposure, there are no large voids. In this case only very small holes are observed where the NaCl once was and are not visible at this magnification. Because of the lack of additional 66 nm of GaAs deposition at 400° C. in this sample, the coverage of the NaCl in the areas without RHEED exposure was very limited. This resulted in desorption of nearly all the NaCl prior to further deposition at 580° C., and essentially a homoepitaxial cell was deposited in this area. However, this area also has a higher degree of surface faceting and roughness than the area having a complete NaCl layer.

For the template without a 400° C. deposition, TEM images of the RHEED exposed area (see Panel (c5) of FIG. 26) show something different. No columnar grain structure is observed; instead the area is epitaxial. Separate TEM imaging of only the template growth (see Panel (c3) of FIG. 26), reveals that the starting template layer is epitaxial as well. Thus, this shows that if a monocrystalline, epitaxial template can be provided, a similarly crystalline cell can be achieved as well, while still maintaining the NaCl layer. The first ~150 nm of GaAs near the interface of the NaCl is highly defective; after ~550 nm the material looks significantly better and continues to improve with further growth. Because the initial 350° C. MME deposition is only ~66 nm thick, this highlights the importance of a buffer layer grown at more standard conditions prior to growth of the actual cell structure. There are still defects observable in the cell portion of the device, but it is possible that these could be engineered out. EBSD looks at larger areas than TEM and shows that the surface is wholly (100) oriented (see Panel (c6) of FIG. 26). It is worth nothing that the unindexable areas here, and in the other EBSD images in this figure, are due to the shadowing present from surface roughness, and not a lack of crystallinity. Cross section EBSD was also performed on this sample (not shown) and did not reveal the presence of any other grain orientations at the interface with the NaCl.

Experimental Methods and Techniques:

Both NaCl and GaAs thin films were deposited on GaAs (001)±0.1° substrates in an Epi930 molecular beam epitaxy (MBE) reactor with base pressure of $4 \times 10^{-9}$ torr. Band-edge thermometry was used to verify the substrate temperature using a kSA BandiT. Reflection high energy electron diffraction (RHEED) with beam energy of 15 kV was employed both as an in-situ diagnostic tool as well as a source of high energy electrons to help promote nucleation of GaAs on NaCl (ACS Omega paper). High-resolution x-ray diffraction (XRD) was performed on a Rigaku Smartlab. Scanning electron microscopy (SEM) and electron backscatter diffraction (EBSD) were used to look at surface morphology and crystallographic properties ex-situ. EBSD data was acquired in an Oxford system using a Symmetry detector with CMOS sensor technology. The acquisition voltage was 20 kV, and the analysis was performed with the sample tilted by 70°.

Transmission electron microscopy (TEM) imaging and electron diffraction patterns were acquired a with JEOL 2100F. The GaAs substrate was tilted so that incident electrons are along <110>. Bright field TEM imaging was performed to show the layers and atomic structure of defects. Electron diffraction images of areas of 100 nm in diameter were acquired to identify the local phases and crystalline orientation. For removal of the GaAs film from the substrate, Kapton tape was first attached to the film and then placed in water to dissolve through the NaCl layer which resulted in near-immediate release of the film from the substrate.

The NaCl (5-9's, Sigma Aldrich) sublimated congruently from a conventional effusion cell operating at ~0.480° C., and As was provided by a valved cracker source. To ensure a clean and oxide free surface, the GaAs substrates were heated to 620° C. for 25 minutes under exposure to excess As flux. Following this, a 300 nm GaAs buffer layer was deposited at 580° C. and subsequently cooled to 150° C. for NaCl deposition. After NaCl deposition, at a rate of 3 nm/min, the RHEED beam was moved across the surface until the diffraction pattern dims. After this, the sample was heated at a rate of 20° C./min to the temperature desired for an initial low temperature GaAs nucleation step (350-400° C.) before high temperature (580° C.) growth, both at a growth rate of ~33 nm/min measured using RHEED oscillations and verified using cross sectional SEM.

Example Set #1

Example 1. A method comprising: depositing a first layer onto a substrate; depositing a second layer onto a surface of the first layer; and separating the substrate from the second layer, wherein: the substrate comprises a first III-V alloy, the second layer comprises second III-V alloy, and the first layer comprises a material that includes at least two of a Group 1A element, a Group 2A element, a Group 6A element, or a halogen.

Example 2. The method of Example 1, wherein the first III-V alloy is different than the second III-V alloy.

Example 3. The method of either Example 1 or Example 2, wherein the first III-V alloy is the same as the second III-V alloy.

Example 4. The method of any one of Examples 1-3, wherein the first III-V alloy comprises at least two of indium, gallium, aluminum, arsenic, phosphorus, antimony, bismuth, or nitrogen.

Example 5. The method of any one of Examples 1-4, wherein the first III-V alloy comprises at least one of InP, GaP, GaSb, or GaAs.

Example 6. The method of any one of Examples 1-5, wherein the second III-V alloy comprises at least two of indium, gallium, aluminum, arsenic, phosphorous, or bismuth.

Example 7. The method of any one of Examples 1-6, wherein the second III-V alloy comprises at least one of GaAs, InGaAs, AlGaAs, InAlGaP, AlGaP, or GaAsBi.

Example 8. The method of any one of Examples 1-7, wherein the material comprises an alkali halide.

Example 9. The method of any one of Examples 1-8, wherein the alkali halide comprises at least one of a Group 1A element or a Group 2A element and at least one halogen.

Example 10. The method of any one of Examples 1-9, wherein the alkali halide material comprises at least one of NaCl, LiBr, $CaF_2$, $BaCl_2$, NaF, or $NaCl_xF_y$.

Example 11. The method of any one of Examples 1-10, wherein the material comprises at least one of a Group 6A element and at least one of Group 1A element or a Group 2A element.

Example 12. The method of any one of Examples 1-11, wherein the material comprises at least one of MgO, CaO, or BeSe.

Example 13. The method of any one of Examples 1-12, wherein the first layer comprises two or more salt layers, with each comprising a different material.

Example 14. The method of any one of Examples 1-13, wherein: the first layer comprises a first salt layer comprising LiBr, and the first layer comprises a second salt layer comprising $BaF_2$.

Example 15. The method of any one of Examples 1-14, wherein each salt layer of the first layer has a different lattice spacing between about 2.7 Å and 6.2 Å.

Example 16. The method of any one of Examples 1-15, wherein the lattice spacing is between about 5.6 Å and about 5.9 Å.

Example 17. The method of any one of Examples 1-16 wherein: the first salt layer has a first lattice spacing of about 2.7 Å, and the second salt layer has a second lattice spacing of about 6.2 Å.

Example 18. The method of any one of Examples 1-17, wherein the second layer comprises two or more layers, with each comprising a different III-V alloy.

Example 19. The method of any one of Examples 1-18, wherein the depositing of the second layer is performed using a hydride vapor phase epitaxy (HVPE) system.

Example 20. The method of any one of Examples 1-19, wherein the depositing of the second layer is performed using a vacuum depositing system.

Example 21. The method of any one of Examples 1-20, wherein the vacuum depositing system comprises a molecular beam epitaxy (MBE) system.

Example 22. The method of any one of Examples 1-21, further comprising, prior to depositing the second layer, treating the surface of the first layer using an electron beam.

Example 23. The method of any one of Examples 1-22, wherein the depositing of the second layer and the treating are performed in a single chamber of the vacuum depositing system.

Example 24. The method of any one of Examples 1-23, wherein: the depositing of the second layer is performed in a first chamber of the vacuum depositing system, and the treating is performed in a second chamber of the vacuum depositing system.

Example 25. The method of any one of Examples 1-24, wherein the treating is halted before the depositing of the second layer.

Example 26. The method of any one of Examples 1-25, wherein the treating is performed for a first time period between greater than zero seconds and less than or equal to 10 minutes.

Example 27. The method of any one of Examples 1-26, wherein the first time period is between about 0.1 seconds and about 5 minutes.

Example 28. The method of any one of Examples 1-27, wherein the electron beam has a power between about 0.1 kV and about 100 kV.

Example 29. The method of any one of Examples 1-28, wherein the power is between about 0.1 kV and about 20 kV.

Example 30. The method of any one of Examples 1-29, wherein the electron beam is provided using a reflection high energy electron diffraction (RHEED) system.

Example 31. The method of any one of Examples 1-30, wherein the depositing of the second layer is performed, while maintaining the first layer at a first temperature between about 90° C. and about 700° C.

Example 32. The method of any one of Examples 1-31, wherein the first temperature is between about 200° C. and about 450° C.

Example 33. The method of any one of Examples 1-32, wherein the depositing of the second layer is performed while the first chamber is maintained at a first pressure between about 1e-9 Torr and about 1e-4 Torr.

Example 34. The method of any one of Examples 1-33 wherein the first pressure is between about 1e-6 Torr and about 1e-4 Torr.

Example 35. The method of any one of Examples 1-34, wherein the depositing of the second layer is performed for a second time period between about 1 second and about 30 minutes.

Example 36. The method of any one of Examples 1-35, wherein the second time period is between about 15 seconds and about 10 minutes Example 37. The method of any one of Examples 1-36, wherein the depositing of the second layer is performed at a first rate between about 0.3 nm/min and about 83 nm/min.

Example 38. The method of any one of Examples 1-37, wherein the first rate is between about 1 nm/min and about 50 nm/min.

Example 39. The method of any one of Examples 1-38, wherein the second layer has a thickness between about 1 nm and about 1000 nm.

Example 40. The method of any one of Examples 1-39, wherein the thickness of the second layer is between about 5 nm and about 200 nm.

Example 41. The method of any one of Examples 1-40, wherein the depositing of the first layer is performed while maintaining the substrate at a second temperature between about 20° C. and about 600° C.

Example 42. The method of any one of Examples 1-41, wherein the second temperature is between about 100° C. and about 400° C.

Example 43. The method of any one of Examples 1-42, wherein the second temperature is maintained at least during the start of growth of the first layer on a surface of the substrate.

Example 44. The method of any one of Examples 1-43, wherein the depositing of the first layer is performed while the first chamber is maintained at a second pressure between about 1e-11 Torr and about 1e-4 Torr.

Example 45. The method of any one of Examples 1-44, wherein the second pressure is between about 1e-9 and 1e-5.

Example 46. The method of any one of Examples 1-45, wherein the first layer has a thickness between about 1 nm and about 1000 nm.

Example 47. The method of any one of Examples 1-46, wherein the thickness of the first layer is between about 2 nm and about 300 nm.

Example 48. The method of any one of Examples 1-47, further comprising, between the depositing of the first layer and the depositing of the second layer, heating the substrate and the first layer from the second temperature to the first temperature.

Example 49. The method of any one of Examples 1-48, wherein, during the heating, the first layer is continuously deposited onto the substrate.

Example 50. The method of any one of Examples 1-49, further comprising, after the depositing of the second layer, removing the first layer from the substrate and the second layer.

Example 51. The method of any one of Examples 1-50, wherein the removing is performed by contacting the first layer with a compound in a state comprising at least one of a liquid or a vapor.

Example 52. The method of any one of Examples 1-51, wherein the compound comprises at least one of water or an organic compound.

Example 53. The method of any one of Examples 1-52, wherein the first layer is at least partially soluble in the compound.

Example 54. The method of any one of Examples 1-53, wherein the organic compound comprises at least one of methanol, ethanol, propanol, or a butanol.

Example 55. The method of any one of Examples 1-54, wherein the removing is performed by contacting the first layer with a solution comprising liquid water.

Example 56. The method of any one of Examples 1-55, wherein the removing is performed by at least one of a mechanical process, an acoustic process, or a heating process.

Example 57. The method of any one of Examples 1-56, wherein the mechanical process comprises spalling.

Example 58. The method of any one of Examples 1-57, wherein the heating process comprises applying a thermal shock to at least one of the substrate, the first layer, or the second layer.

Example Set #2

Example 1. A method comprising: using an electron beam, treating a surface of a first layer comprising an alkali halide material; and depositing onto the treated surface a second layer comprising a III-V alloy, wherein: the treating and depositing are performed in a single chamber of a molecular beam epitaxy (MBE) system.

Example 2. The method of Example 1, wherein the depositing of the second layer and the treating are performed in a single chamber of the vacuum depositing system.

Example 3. The method of either Example 1 or Example 2, wherein: the depositing of the second layer is performed in a first chamber of the vacuum depositing system, and the treating is performed in a second chamber of the vacuum depositing system.

Example 4. The method of any one of Examples 1-3, wherein the treating is halted before the depositing of the second layer.

Example 5. The method of any one of Examples 1-4, wherein the treating is performed for a first time period between greater than zero seconds and less than or equal to 10 minutes.

Example 6. The method of any one of Examples 1-5, wherein the first time period is between about 0.1 seconds and about 5 minutes.

Example 7. The method of any one of Examples 1-6, wherein the electron beam has a power between about 0.1 kV and about 100 kV.

Example 8. The method of any one of Examples 1-7, wherein the power is between about 0.1 kV and about 20 kV.

Example 9. The method of any one of Examples 1-8, wherein the electron beam is provided using a reflection high energy electron diffraction (RHEED) system.

Example Set #3

Example 1. A composition comprising, in order: a substrate; a first layer; and a second layer, wherein: the substrate comprises a first III-V alloy, the second layer comprises second III-V alloy, and the first layer comprises a material that includes at least one of a Group 1A element, a Group 2A element, or a Group 6A element and a halogen.

Example 2. The composition of Example 1, wherein the first III-V alloy is different than the second III-V alloy.

Example 3. The composition of either Example 1 or Example 2, wherein the first III-V alloy is the same as the second III-V alloy.

Example 4. The composition of any one of Examples 1-3, wherein the first III-V alloy comprises at least two of indium, gallium, aluminum, arsenic, phosphorus, antimony, bismuth, or nitrogen.

Example 5. The composition of any one of Examples 1-4, wherein the first III-V alloy comprises at least one of InP, GaP, GaSb, or GaAs.

Example 6. The composition of any one of Examples 1-5, wherein the second III-V alloy comprises at least two of indium, gallium, aluminum, arsenic, phosphorous, or bismuth.

Example 7. The composition of any one of Examples 1-6, wherein the second III-V alloy comprises at least one of GaAs, InGaAs, AlGaAs, InAlGaP, AlGaP, or GaAsBi.

Example 8. The composition of any one of Examples 1-7, wherein the material comprises an alkali halide.

Example 9. The composition of any one of Examples 1-8, wherein the alkali halide comprises at least one of a Group 1A element or a Group 2A element and at least one halogen.

Example 10. The composition of any one of Examples 1-9, wherein the alkali halide material comprises NaCl, LiBr, $CaF_2$, $BaCl_2$, NaF, or $NaCl_xF_y$.

Example 11. The composition of any one of Examples 1-10, wherein the material comprises at least one of a Group 6A element and at least one of Group 1A element or a Group 2A element.

Example 12. The composition of any one of Examples 1-11, wherein the material comprises at least one of MgO, CaO, or BeSe.

Example 13. The composition of any one of Examples 1-12, wherein the first layer comprises two or more salt layers, with each comprising a different material.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method comprising:
depositing a first layer onto a substrate;
depositing a second layer onto a surface of the first layer; and
removing the substrate from the second layer, wherein:
the substrate comprises a first III-V alloy,
the second layer comprises second III-V alloy,
the first layer comprises a material that includes at least two of a Group 1A element, a Group 2A element, a Group 6A element, or a halogen, and
there is no intervening layer between the first layer and the second layer.

2. The method of claim 1, wherein the first III-V alloy comprises at least two of indium, gallium, aluminum, arsenic, phosphorus, antimony, bismuth, or nitrogen.

3. The method of claim 1, wherein the second III-V alloy comprises at least two of indium, gallium, aluminum, arsenic, phosphorous, or bismuth.

4. The method of claim 1, wherein the material comprises an alkali halide.

5. The method of claim 4, wherein the alkali halide comprises at least one of a Group 1A element or a Group 2A element and at least one halogen.

6. The method of claim 1, wherein the alkali halide material comprises at least one of NaCl, LiBr, CaF$_2$, BaCl$_2$, NaF, or NaCl$_x$F$_y$.

7. The method of claim 1, wherein the material comprises at least one of a Group 6A element and at least one of Group 1A element or a Group 2A element.

8. The method of claim 7, wherein the material comprises at least one of MgO, CaO, or BeSe.

9. The method of claim 1, wherein the depositing of the second layer is performed using a hydride vapor phase epitaxy (HVPE) system.

10. The method of claim 1, wherein the depositing of the second layer is performed using a vacuum depositing system.

11. The method of claim 10, wherein the vacuum depositing system comprises a molecular beam epitaxy (MBE) system.

12. The method of claim 1, further comprising, prior to depositing the second layer, treating the surface of the first layer using an electron beam.

13. The method of claim 12, wherein:
the depositing of the second layer is performed in a first chamber of the vacuum depositing system, and
the treating is performed in a second chamber of the vacuum depositing system.

14. The method of claim 12, wherein the treating is performed for a first time period between greater than zero seconds and less than or equal to 10 minutes.

15. The method of claim 12, wherein the electron beam has a power between 0.1 kV and 100 kV.

16. The method of claim 12, wherein the electron beam is provided using a reflection high energy electron diffraction (RHEED) system.

17. The method of claim 1, wherein the depositing of the second layer is performed, while maintaining the first layer at a first temperature between 90° C. and 700° C.

18. The method of claim 13, wherein the depositing of the first layer is performed while maintaining the substrate at a second temperature between 20° C. and 600° C.

19. The method of claim 1, wherein the removing is performed by contacting the first layer with a compound in a state comprising at least one of a liquid or a vapor.

20. The method of claim 19, wherein the compound comprises at least one of water or an organic compound.

21. A method comprising:
using an electron beam, treating a surface of a first layer comprising an alkali halide material; and
depositing onto the treated surface a second layer comprising a III-V alloy, wherein:
the treating and depositing are performed in a single chamber of a molecular beam epitaxy (MBE) system.

22. A device comprising, in order:
a substrate;
a first layer; and
a second layer, wherein:
the substrate comprises a first III-V alloy,
the second layer comprises second III-V alloy,
the first layer comprises a material that includes at least one of a Group 1A element, a Group 2A element, a Group 6A element, or a halogen, and
there is no intervening layer between the first layer and the second layer.

23. The method of claim 21, wherein the depositing and the treating are performed in a single chamber of the MBE system.

24. The method of claim 21 wherein:
the depositing is performed in a first chamber of the MBE system, and
the treating is performed in a second chamber of the MBE system.

25. The method of claim 21, wherein the treating is halted before the depositing.

26. The method of claim 21, wherein the treating is performed for a first time period between greater than zero seconds and less than or equal to 10 minutes.

27. The method of claim 26, wherein the first time period is between 0.1 seconds and 5 minutes.

28. The method of claim 21, wherein the electron beam has a power between 0.1 kV and 100 kV.

29. The method of claim 28, wherein the power is between 0.1 kV and 20 kV.

30. The method of claim 21, wherein the electron beam is provided using a reflection high energy electron diffraction system.

* * * * *